United States Patent
Numata

(10) Patent No.: US 8,615,857 B2
(45) Date of Patent: Dec. 31, 2013

(54) METHOD OF MANUFACTURING PIEZOELECTRIC VIBRATORS

(75) Inventor: Masashi Numata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 615 days.

(21) Appl. No.: 12/870,161

(22) Filed: Aug. 27, 2010

(65) Prior Publication Data

US 2011/0050047 A1    Mar. 3, 2011

(30) Foreign Application Priority Data

Aug. 28, 2009  (JP) .................................. 2009-198708

(51) Int. Cl.
*H04R 17/10*   (2006.01)
*B23K 26/38*   (2006.01)

(52) U.S. Cl.
USPC ............... 29/25.35; 29/830; 29/417; 29/594; 219/121.68; 219/121.69; 310/344; 310/354; 310/370; 438/460

(58) Field of Classification Search
USPC ..................... 29/25.35, 594, 830, 412, 417; 219/121.68, 121.69; 438/460; 310/344, 310/349, 354, 370; 216/33
See application file for complete search history.

(56) References Cited

U.S. PATENT DOCUMENTS

| | | | | |
|---|---|---|---|---|
| 5,736,061 A | * | 4/1998 | Fukada et al. | 216/33 |
| 7,294,951 B2 | * | 11/2007 | Oouchi et al. | 29/25.35 X |
| 2003/0129809 A1 | * | 7/2003 | Takyu et al. | 438/460 |
| 2005/0236380 A1 | * | 10/2005 | Tsuno et al. | 219/121.69 |

FOREIGN PATENT DOCUMENTS

| | | | | |
|---|---|---|---|---|
| JP | 60072409 A | * | 4/1985 | 29/25.35 |
| JP | 2000-219528 A | | 8/2000 | |
| JP | 2004-307318 A | | 11/2004 | |

* cited by examiner

*Primary Examiner* — A. Dexter Tugbang
(74) *Attorney, Agent, or Firm* — Brinks Gilson & Lione

(57) ABSTRACT

Providing a glass assembly cutting method capable of improving yield by cutting a glass assembly into a predetermined size, providing a package manufacturing method, a package and a piezoelectric vibrator manufactured by the manufacturing method, and an oscillator, an electronic device, and a radio-controlled timepiece. Providing a wafer assembly cutting method of cutting a wafer assembly 60 along a scribe line M', the method including: a scribing step of irradiating a laser beam having an absorption wavelength of the wafer assembly 60 along the contour line to form the scribe line M' on a lid board wafer 50; and a breaking step of applying a breaking stress along the scribe line M' using a cutting blade to cut the wafer assembly along the scribe line M', wherein the scribing step involves forming the scribe line M' so that the ratio of a depth dimension D of the scribe line M' to a width dimension W thereof is 0.8 or larger and 6.0 or smaller.

10 Claims, 17 Drawing Sheets

METHOD OF MANUFACTURING PIEZOELECTRIC VIBRATORS

RELATED APPLICATIONS

This application claims priority under 35 U.S.C. §119 to Japanese Patent Application No. 2009-198708 filed on Aug. 28, 2009, the entire content of which is hereby incorporated by reference.

BACKGROUND OF THE INVENTION

1. Field of the Invention

The present invention relates to a glass assembly cutting method, a package manufacturing method, a package, a piezoelectric vibrator, and an oscillator, an electronic device, and a radio-controlled timepiece.

2. Description of the Related Art

Recently, a piezoelectric vibrator (package) utilizing quartz or the like has been used in a cellular phone and a portable information terminal as the time source, the timing source of a control signal, a reference signal source, and the like. The piezoelectric vibrator of this type is proposed in a variety of forms, and an SMD-type piezoelectric vibrator is one example. The SMD-type piezoelectric vibrator includes, for example, a base board and a lid board which are bonded to each other, a cavity formed between the two boards, and a piezoelectric vibrating reed (electronic component) accommodated in a state of being airtightly sealed in the cavity.

When the piezoelectric vibrator is manufactured, recess portions for cavities are formed on a lid board wafer, and a piezoelectric vibrating reed is mounted on a base board wafer. Thereafter, the two wafers are anodically bonded with a bonding layer (bonding material) disposed therebetween, thus obtaining a wafer assembly in which a plurality of packages is formed in the matrix direction of the wafers. Then, the wafer assembly is cut into respective packages (cavities) formed on the wafer assembly, whereby a plurality of piezoelectric vibrators in which the piezoelectric vibrating reed is airtightly sealed in the cavity is manufactured.

As a method of cutting the wafer assembly, there is known a method in which the wafer assembly is cut (diced) along its thickness direction using a blade having diamond attached to its tooth tip, for example.

However, the blade cutting method has the following problems. Since it is necessary to provide a cutting zone between formation regions of the piezoelectric vibrators considering the width dimension of the blade, the number of piezoelectric vibrators obtainable from one wafer assembly is small. In addition, since the blade cutting method produces chippings during the cutting, the wafer assembly is likely to start breaking with the chippings, and the cutting surface is coarse. Moreover, another problem is poor production efficiency due to its low cutting speed.

There is known another cutting method in which a cut (scribe line) is inscribed along an intended cutting line on the surface of the wafer assembly using diamond buried in a tip end of a metal rod, and the wafer assembly is cut by applying a breaking stress along the scribe line.

However, since this cutting method produces many chippings on the scribe line, there is a problem in that the wafer assembly is likely to start breaking with the chippings, and the cutting surface is coarse. Therefore, it is difficult to use this method in manufacturing such small electronic components as the piezoelectric vibrators.

In order to solve the above-mentioned problems, Japanese Patent 3577492, for example, discloses a method of performing a chemical treatment on a wafer assembly so as to remove chippings produced when a scribe line is formed and applying a mechanical or thermal stress to the scribe line to cut and divide the wafer assembly.

However, the chemical treatment requires a special chemical treatment machine, and it is necessary to perform a post-treatment on the wafer assembly after the chemical treatment. Therefore, there is a problem in that the equipment cost and the number of manufacturing steps are increased.

In addition, JP-A-2000-219528, for example, discloses a method of irradiating a laser beam onto an intended cutting line of a wafer assembly to form a scribe line and rapidly cooling the wafer assembly, thereby cutting the wafer assembly using a thermal shock generated during the rapid cooling.

However, since the method of JP-A-2000-219528 involves rapidly cooling the wafer assembly, there is a concern about deformation on the cutting surface. Therefore, this method is not suitable for cutting such small electronic components particularly as piezoelectric vibrators.

In recent years, there has been developed a method of forming a groove (scribe line) by irradiating a laser beam onto one surface of the wafer assembly and bringing a cutting blade into contact with the other surface of the wafer assembly, thus cutting the wafer assembly by applying a mechanical breaking stress with the cutting blade. By the contacting cutting blade, the breaking stress is concentrated on the wafer assembly. In this way, a crack is formed at the groove in a thickness direction of the wafer assembly. As a result, since the wafer assembly is cut in such a way that it is divided along the groove, the wafer assembly can be smoothly cut along the intended cutting line.

When the scribe line is formed by laser irradiation, the width dimension thereof is determined by the spot diameter of the laser beam, and the depth dimension is determined by the laser irradiation time (the amount of energy applied to the wafer assembly).

In this case, if the depth dimension of the scribe line is too much larger than the width dimension, the amount of laser energy applied to the wafer assembly becomes too large, and thus the wafer assembly will be damaged greatly. As a result, the wafer assembly may be destroyed (crashed) in pieces when the breaking stress is applied during the cutting. Moreover, there is a problem in that the laser irradiation time increases, and thus the manufacturing efficiency decreases.

On the other hand, if the depth dimension of the scribe line is too much smaller than the width dimension, there is a problem in that the scribe line does not serve as the breaking starting point at the time of applying the breaking stress, and the wafer assembly is hardly broken.

In addition, when a wafer assembly 203 shown in FIG. 19 is cut, since the wafer assembly 203 includes two board wafers 200 and 201 which are laminated with a bonding layer 202 disposed therebetween, it is necessary to apply a larger breaking stress to the wafer assembly 203 compared to the case of cutting a single board wafer.

In this case, when the breaking stress is applied to the wafer assembly 203 using a cutting blade 205 having a small blade edge angle and a small thickness, the cutting blade 205 may be bent. Therefore, the blade edge comes into contact with a position different from the scribe line M', and the breaking stress is concentrated on that position. As a result, there is a problem in that the wafer assembly 203 starts breaking from the position different from the scribe line M' (namely, a so-called slip phenomenon occurs). Therefore, the wafer assembly 203 starts breaking obliquely from that position. On the other hand, if the blade edge angle of the cutting blade 205 is too large, even when the cutting blade 205 is brought into contact, the breaking stress is not concentrated on the wafer assembly 203, and the wafer assembly 203 may be destroyed (crashed) in pieces.

As a result, in the worst case, the cavity C may communicate with the outside, thus making it unable to maintain the airtightness in the cavity C. Such a product will be treated as defective, there is a problem in that the number of non-defective products picked out of the wafer assembly 203 will decrease and the yield will decrease.

SUMMARY OF THE INVENTION

The present invention has been made in view of the foregoing, and an object of the present invention is to provide a glass assembly cutting method capable of improving yield by cutting a glass assembly into a predetermined size. Another object of the present invention is to provide a package manufacturing method, a package, a piezoelectric vibrator, an oscillator, an electronic device, and a radio-controlled timepiece.

The present invention provides the following means in order to solve the problems.

According to an aspect of the present invention, there is provided a glass assembly cutting method of cutting a glass assembly along an intended cutting line, the glass assembly having a plurality of glass boards bonded together with respective bonding surfaces thereof being bonded by a bonding material, the method including: a groove forming step of irradiating a laser beam having an absorption wavelength of the glass assembly along the intended cutting line to form a groove on one surface of the glass assembly; and a cutting step of applying a breaking stress along the intended cutting line of the glass assembly using a cutting blade to cut the glass assembly along the intended cutting line, wherein the groove forming step involves forming the groove so that the ratio of a depth dimension of the groove to a width dimension thereof is 0.8 or larger and 6.0 or smaller.

According to this configuration, since the groove is formed so that the ratio of the depth dimension of the groove to the width dimension is 0.8 or larger, when a breaking stress is applied to the glass assembly during the cutting step, the groove serves as the cutting starting point, and a crack is formed on the glass assembly along the thickness direction thereof. In this way, since the glass assembly is cut in such a way that it is divided along the groove, the glass assembly is smoothly cut along the intended cutting line.

On the other hand, since the groove is formed so that the ratio of the depth dimension of the groove to the width dimension is 6.0 or smaller, it is not necessary to irradiate an excessive amount of laser energy, and thus the damage on the glass assembly resulting from the laser irradiation during the groove forming step can be suppressed. As a result, it is possible to prevent crashing during the cutting step. In addition, it is possible to shorten the laser irradiation time and improve the manufacturing efficiency.

Therefore, it is possible to improve surface precision of the cutting surface and prevent breaking or the like of the glass assembly, thus cutting the glass assembly to a desired size.

In the cutting step, a blade edge angle of the cutting blade may be 80° or larger and 100° or smaller.

According to this configuration, since the blade edge angle is set to 80° or larger, the above-described slip phenomenon will not take place when the breaking stress is applied to the glass assembly, and thus the breaking stress can be effectively applied along the intended cutting line. Therefore, it is possible to facilitate the progress of cracking in the thickness direction of the glass assembly.

On the other hand, since the blade edge angle is set to 100° or smaller, the breaking stress can be concentrated on the glass assembly, and the above-described crashing can be prevented.

Therefore, it is possible to cut the glass assembly in a smooth and easy manner and obtain a cutting surface having better surface precision.

The cutting step may involve applying a breaking stress onto the other surface of the glass assembly.

According to this configuration, since the breaking stress is applied onto the other surface of the glass assembly, it is possible to generate a large breaking stress on the bottom of the groove. Therefore, it is possible to cut the glass assembly in a smoother and easier manner and obtain a cutting surface having considerably better surface precision.

The manufacturing method may include an attaching step of a protection film for protecting the glass assembly to the one surface of the glass assembly prior to the cutting step, and the protection film may have a thickness of 20 µm or more and 30 µm or less.

If the thickness of the protection film is too small (the thickness of the protection film is smaller than 20 µm), the protection film may be cut together with the glass assembly. On the other hand, if the thickness of the protection film is too large (the thickness of the protection film is larger than 30 µm), the breaking stress acting on the bonding glass may be reduced by the protection film, and thus, the glass assembly may not be cut smoothly, and the surface precision of the cutting surface decreases.

On the contrary, according to the configuration of the present invention, since the thickness of the protection film is 20 µm or more, the protection film will not be cut together with the glass assembly during the cutting step. On the other hand, since the thickness of the protection film is 30 µm or less, the breaking stress acting on the glass assembly will not be reduced by the protection film, and accordingly, the glass assembly can be cut in a smoother and easier manner.

According to another aspect of the present invention, there is provided a method for manufacturing a package having a cavity capable of sealing an electronic component at an inside of the glass assembly using the glass assembly cutting method according to the above aspect of the present invention, wherein the cutting step involves cutting the glass assembly along the intended cutting line disposed between a plurality of formation regions of the package.

According to this configuration, since the package is manufactured using the glass assembly cutting method according to the above aspect of the present invention, the glass assembly can be smoothly cut along the intended cutting line of each package formation region during the cutting. In this way, it is possible to improve the surface precision of a cutting surface and prevent breaking or the like of the glass boards, thus cutting the glass assembly to a desired size.

As a result, it is possible to secure airtightness in the cavity and provide a package having high reliability. Therefore, it is possible to increase the number of packages picked out as non-defective products and thus to improve yield.

According to a further aspect of the present invention, there is provided a package which is formed using the glass assembly cutting method and has a cavity capable of sealing an electronic component at an inside of the glass assembly, wherein a chamfered portion where the groove is divided is provided on the one surface of the glass assembly.

According to this configuration, even when a mechanism for picking out the package comes into contact with the corners of the package when the cut packages are picked out, since it is possible to suppress generation of chippings associated with contacting, the packages can be picked out as non-defective products.

The chamfered portions can be formed automatically by cutting the glass assembly along the groove (intended cutting line) after forming the groove with laser irradiation. Therefore, it is possible to form the chamfered portions more quickly and easily compared with the case of forming the chamfered portions in the respective cut packages as a separate step. As a result, it is possible to improve workability.

In addition, by cutting the glass assembly along the groove, it is possible to improve the surface precision of the cutting surface of the package and provide a package having high reliability.

According to a still further aspect of the present invention, there is provided a piezoelectric vibrator in which a piezoelectric vibrating reed is airtightly sealed in the cavity of the package according to the above aspect of the present invention.

According to this configuration, it is possible to provide a piezoelectric vibrator which secures airtightness in the cavity and provides excellent vibration characteristics.

According to a still further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a timer portion.

According to a still further aspect of the present invention, there is provided a radio-controlled timepiece in which the piezoelectric vibrator according to the above aspect of the present invention is electrically connected to a filter portion.

In the oscillator, electronic device, and radio-controlled timepiece according to the above aspect of the present invention, since they have the above-described piezoelectric vibrator, it is possible to provide products having high reliability similarly to the piezoelectric vibrator.

According to the glass assembly cutting method according to the above aspect of the present invention, since the groove is formed so that the ratio of the depth dimension of the groove to the width dimension is 0.8 or larger, when a breaking stress is applied to the glass assembly during the cutting step, the groove serves as the cutting starting point, and a crack is formed on the glass assembly along the thickness direction thereof. In this way, since the glass assembly is cut in such a way that it is divided along the groove, the glass assembly is smoothly cut along the intended cutting line.

On the other hand, since the groove is formed so that the ratio of the depth dimension of the groove to the width dimension is 6.0 or smaller, it is not necessary to irradiate an excessive amount of laser energy, and thus the damage on the glass assembly resulting from the laser irradiation can be suppressed. As a result, it is possible to prevent crashing during the cutting step. In addition, it is possible to shorten the laser irradiation time and improve the manufacturing efficiency.

Therefore, it is possible to improve surface precision of the cutting surface and prevent breaking or the like of the glass assembly during cutting, thus cutting the glass assembly to a desired size.

According to the package manufacturing method and the package according to the above aspect of the present invention, since the package is manufactured using the glass assembly cutting method according to the above aspect of the present invention, it is possible to secure airtightness in the cavity and provide a package having high reliability. Therefore, it is possible to increase the number of packages picked out as non-defective products and thus to improve yield.

According to the piezoelectric vibrator according to the above aspect of the present invention, it is possible to provide a piezoelectric vibrator which secures airtightness in the cavity and provides excellent vibration characteristics and high reliability.

According to the oscillator, electronic device, and radio-controlled timepiece according to the above aspect of the present invention, since they have the above-described piezoelectric vibrator, it is possible to provide products having high reliability similarly to the piezoelectric vibrator.

DETAILED DESCRIPTION OF THE PREFERRED EMBODIMENTS

Hereinafter, an embodiment of the present invention will be described with reference to the drawings.

Piezoelectric Vibrator

Figure 1:
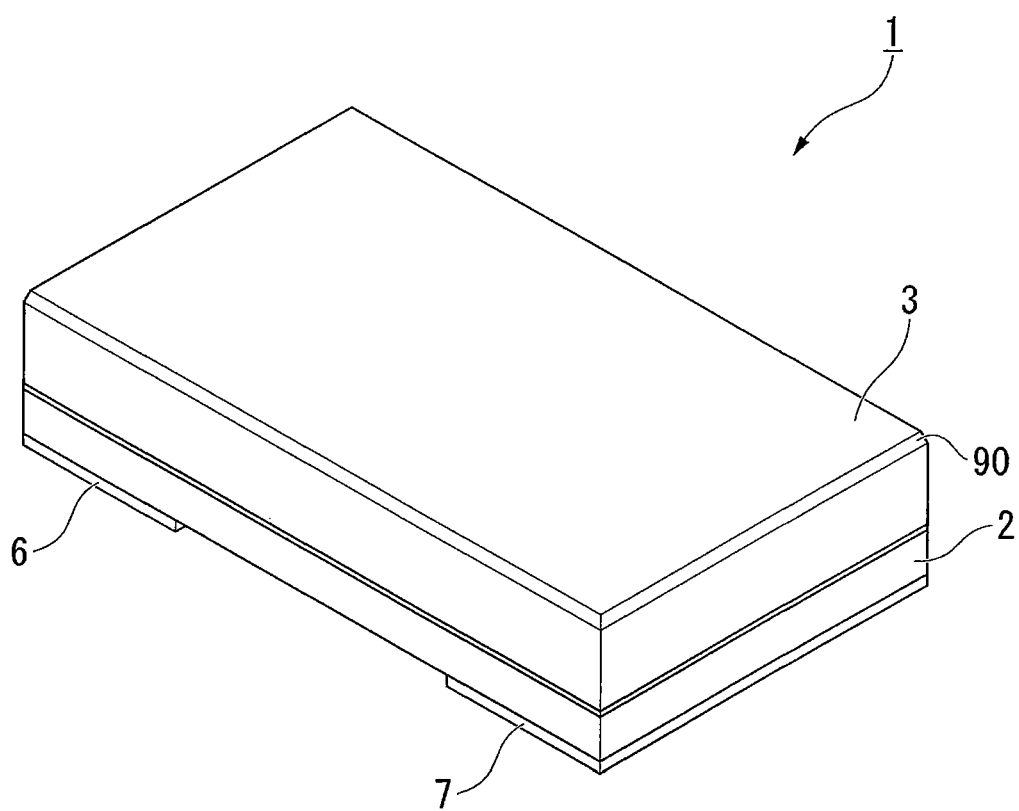
FIG. 1 is a perspective view showing an external appearance of a piezoelectric vibrator according to an embodiment of the present invention.
Figure 2:
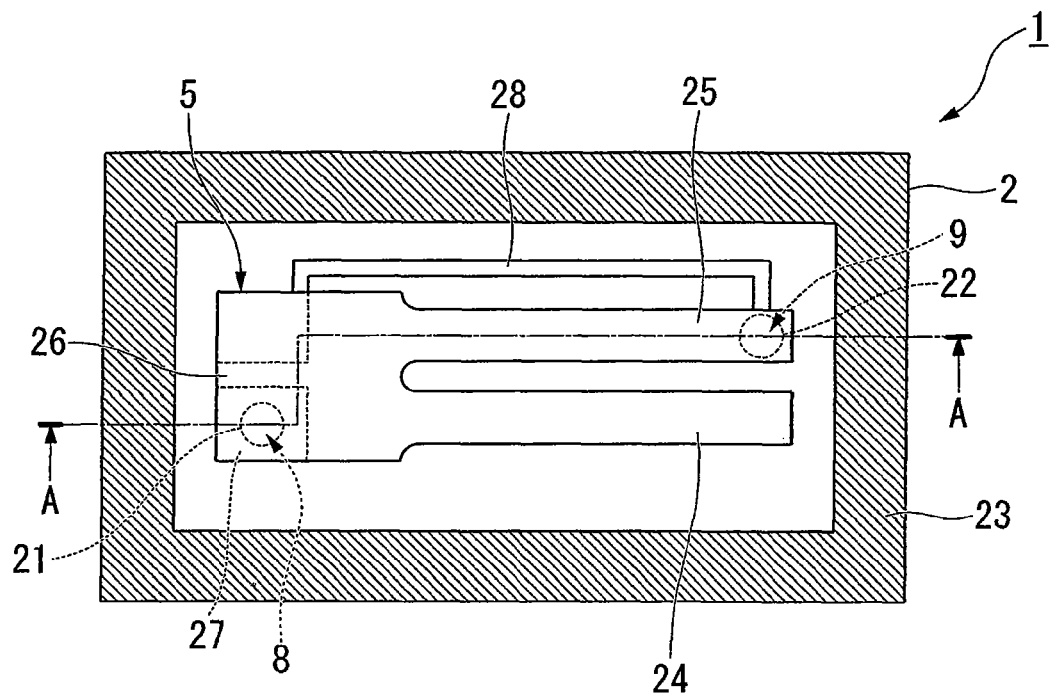
FIG. 2 is a top view showing an inner structure of the piezoelectric vibrator shown in FIG. 1 when a piezoelectric vibrating reed is viewed from above with a lid board removed.
Figure 3:
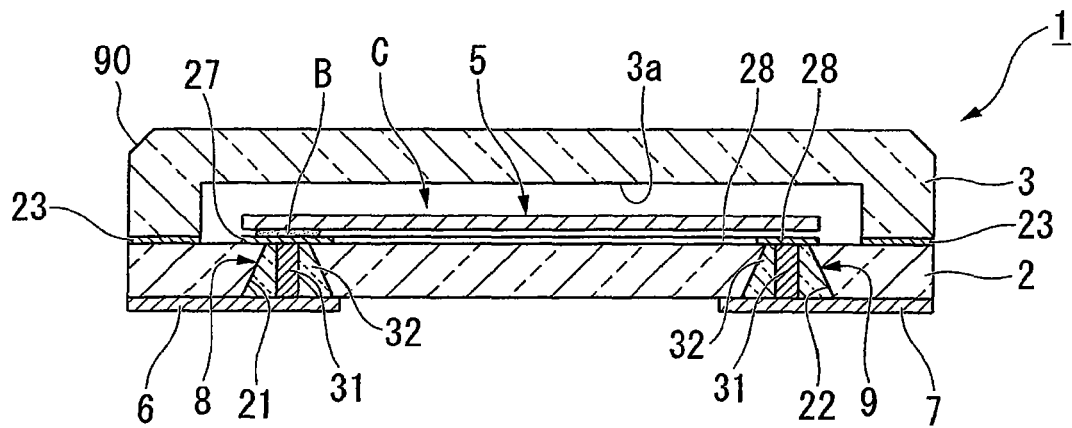
FIG. 3 is a sectional view of the piezoelectric vibrator taken along the line A-A in FIG. 2.
Figure 4:
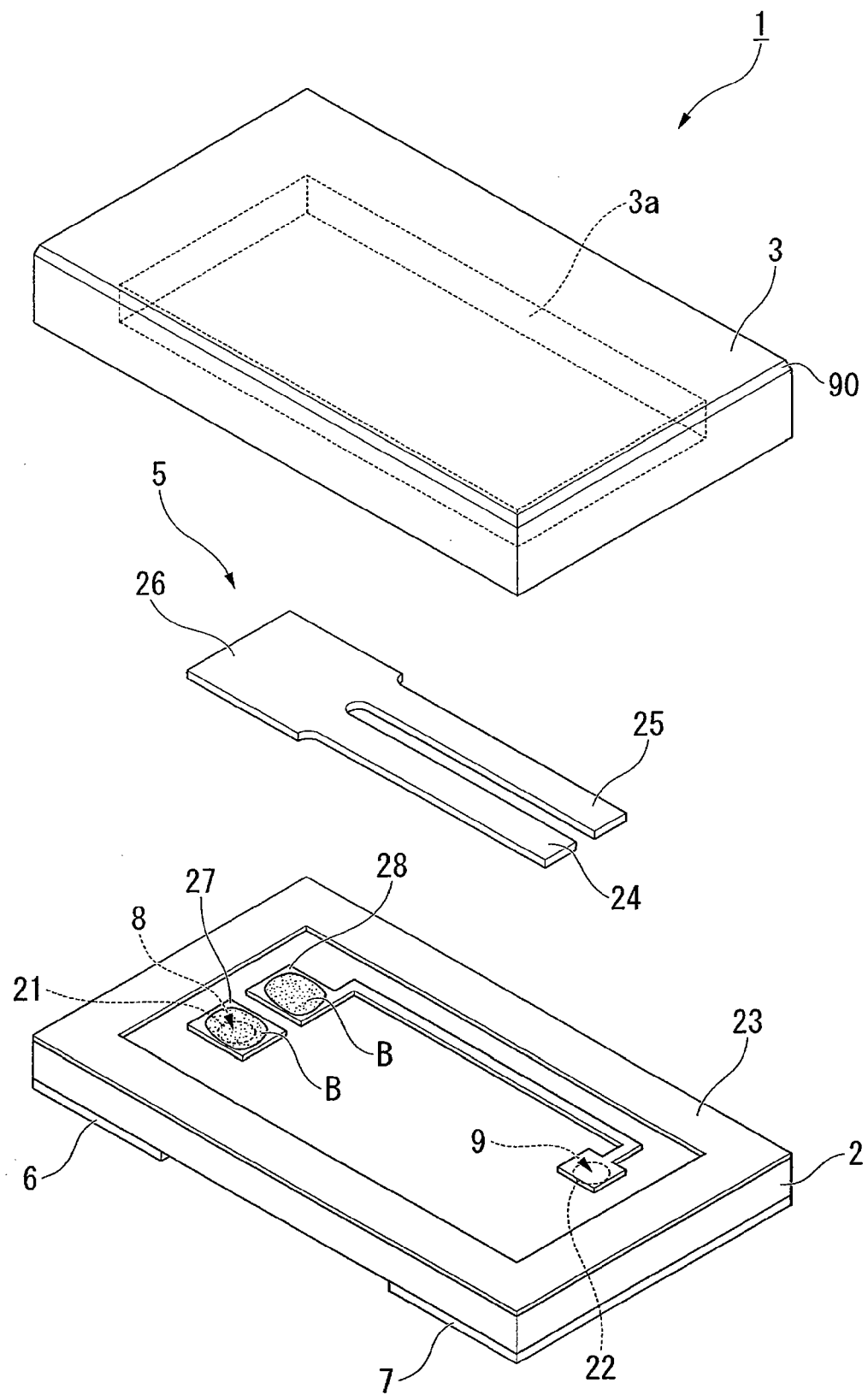
FIG. 4 is an exploded perspective view of the piezoelectric vibrator shown in FIG. 1.

FIG. 1 is a perspective view showing an external appearance of a piezoelectric vibrator according to an embodiment. FIG. 2 is a top view showing an inner structure of the piezoelectric vibrator when a piezoelectric vibrating reed is viewed from above with a lid board removed. FIG. 3 is a sectional view of the piezoelectric vibrator taken along the line A-A in FIG. 2, and FIG. 4 is an exploded perspective view of the piezoelectric vibrator.

As shown in FIGS. 1 to 4, a piezoelectric vibrator 1 is an SMD-type piezoelectric vibrator 1 which is formed in the form of a box laminated in two layers of a base board 2 and a lid board 3 and in which a piezoelectric vibrating reed 5 is accommodated in a cavity C at an inner portion thereof. The piezoelectric vibrating reed 5 and outer electrodes 6 and 7 which are provided at an outer side of the base board 2 are electrically connected to each other by a pair of penetration electrodes 8 and 9 penetrating through the base board 2.

The base board 2 is a transparent insulating board made of a glass material, for example, soda-lime glass, and is formed in a board-like form. The base board 2 is formed with a pair of through-holes 21 and 22 in which a pair of penetration electrodes 8 and 9 is formed. The through-holes 21 and 22 are formed in a tapered form in sectional view whose diameter gradually decreases from the outer end surface (the lower surface in FIG. 3) of the base board 2 towards the inner end surface (the upper surface in FIG. 3).

The lid board 3 is a transparent insulating board made of glass material, for example, soda-lime glass, similarly to the base board 2, and is formed in a board-like form having a size capable of being superimposed onto the base board 2. A bonding surface side of the lid board 3 to be bonded with the base board 2 is formed with a rectangular recess portion 3a in which the piezoelectric vibrating reed 5 is accommodated.

The recess portion 3a forms a cavity C that accommodates the piezoelectric vibrating reed 5 when the base board 2 and the lid board 3 are superimposed onto each other. The lid board 3 is anodically bonded to the base board 2 with a bonding layer 23 described later disposed therebetween in a state where the recess portion 3a faces the base board 2. On the upper peripheral edge of the lid board 3, chamfered portions 90 are formed by chamfering the corners of the lid board 3 during a scribing step described later of the manufacturing process of the piezoelectric vibrator 1.

The piezoelectric vibrating reed 5 is a tuning-fork type vibrating reed which is made of a piezoelectric material such as quartz crystal, lithium tantalate, or lithium niobate and is configured to vibrate when a predetermined voltage is applied thereto.

The piezoelectric vibrating reed 5 is a tuning-fork piezoelectric vibrating reed which includes a pair of vibrating arms 24 and 25 disposed in parallel to each other and a base portion 26 to which the base end sides of the pair of vibrating arms 24 and 25 are integrally fixed. The piezoelectric vibrating reed 5 includes an excitation electrode which is formed on the outer surfaces of the pair of vibrating arms 24 and 25 so as to allow the pair of vibrating arms 24 and 25 to vibrate and includes a pair of first and second excitation electrodes (not shown); and a pair of mount electrodes (not shown) which electrically connects the first and second excitation electrodes to lead-out electrodes 27 and 28 described later.

As shown in FIGS. 3 and 4, the piezoelectric vibrating reed 5 configured in this way is bump-bonded on the lead-out electrodes 27 and 28, which are formed on the inner end surface of the base board 2, using bumps B made of gold or the like. More specifically, the first excitation electrode of the piezoelectric vibrating reed 5 is bump-bonded on one lead-out electrode 27 via one mount electrode and the bumps 8, and the second excitation electrode is bump-bonded on the other lead-out electrode 28 via the other mount electrode and the bumps B. In this way, the piezoelectric vibrating reed 5 is supported in a state of being floated from the inner end surface of the base board 2, and the mount electrodes and the lead-out electrodes 27 and 28 are electrically connected to each other.

A bonding layer 23 for anodic bonding made of a conductive material (for example, aluminum) is formed on the inner end surface side of the base board 2 (the bonding surface side to be bonded with the lid board 3). The bonding layer 23 has a thickness of 3000 Å to 5000 Å, for example, and is formed along the peripheral edge of the base board 2 so as to surround the periphery of the recess portion 3a formed on the lid board 3. The base board 2 and the lid board 3 are anodically bonded with the bonding layer 23 disposed therebetween in a state where the recess portion 3a faces the bonding surface of the base board 2.

The outer electrodes 6 and 7 are provided at both longitudinal ends of the outer end surface of the base board 2 and are electrically connected to the piezoelectric vibrating reed 5 via the penetration electrodes 8 and 9 and the lead-out electrodes 27 and 28. More specifically, one outer electrode 6 is electrically connected to one mount electrode of the piezoelectric vibrating reed 5 via one penetration electrode 8 and one lead-out electrode 27. On the other hand, the other outer electrode 7 is electrically connected to the other mount electrode of the piezoelectric vibrating reed 5 via the other penetration electrode 9 and the other lead-out electrode 28.

The penetration electrodes 8 and 9 are formed by a cylindrical member 32 and a core portion 31 which are integrally fixed to the through-holes 21 and 22 by baking. The penetration electrodes 8 and 9 serve to maintain air-tightness of the inside of the cavity C by completely closing the through-holes 21 and 22 and achieve electrical connection between the outer electrodes 6 and 7 and the lead-out electrodes 27 and 28. Specifically, one penetration electrode 8 is disposed below the lead-out electrode 27 and between the outer electrode 6 and the base portion 26. The other penetration electrode 9 is disposed below the lead-out electrode 28 and between the outer electrode 7 and the vibrating arm 25.

The cylindrical member 32 is obtained by baking a paste-like glass frit. The cylindrical member 32 has a cylindrical shape of which both ends are flat and which has approximately the same thickness as the base board 2. The core portion 31 is disposed at the center of the cylindrical member 32 so as to penetrate through the central hole of the cylindrical member 32. In the present embodiment, the cylindrical member 32 has an approximately conical outer shape (a tapered sectional shape) so as to comply with the shapes of the through-holes 21 and 22. The cylindrical member 32 is baked in a state of being buried in the through-holes 21 and 22 and is tightly attached to the through-holes 21 and 22.

The core portion 31 is a conductive cylindrical core material made of metallic material, and similarly to the cylindrical member 32, has a shape of which both ends are flat ends and which has approximately the same thickness as the base board 2.

The electrical connection of the penetration electrodes 8 and 9 is secured via the conductive core portion 31.

When the piezoelectric vibrator 1 configured in this manner is operated, a predetermined drive voltage is applied between the pair of outer electrodes 6 and 7 formed on the base board 2. In this way, a current can be made to flow to the excitation electrodes of the piezoelectric vibrating reed 5, and the pair of vibrating arms 24 and 25 is allowed to vibrate at a predetermined frequency in a direction to move closer to or away from each other. This vibration of the pair of vibrating arms 24 and 25 can be used as the time source, the timing source of a control signal, the reference signal source, and the like.

Piezoelectric Vibrator Manufacturing Method

Next, a method for manufacturing the above-described piezoelectric vibrator will be described with reference to the flowchart shown in FIG. 5.

Figure 5:
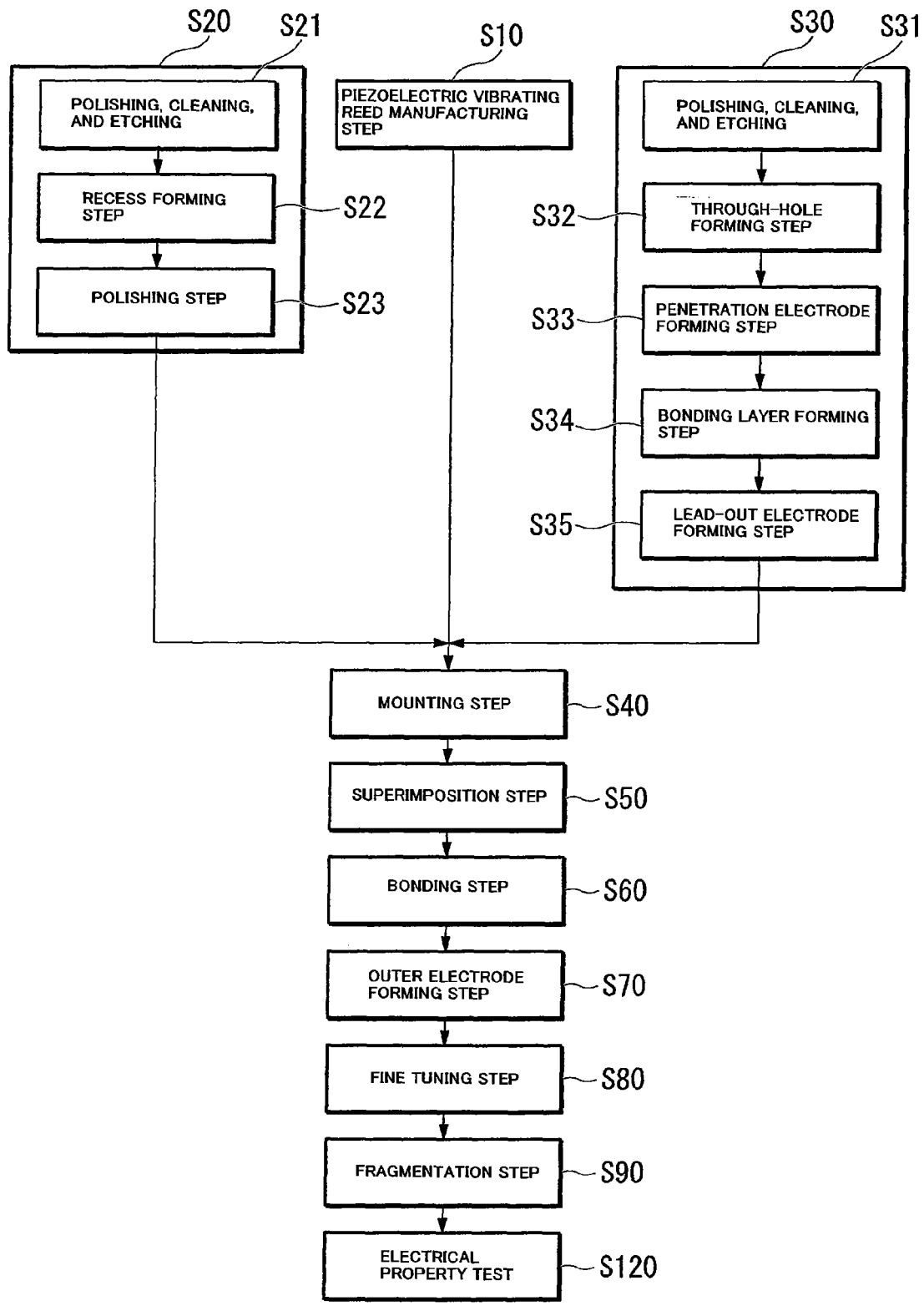
FIG. 5 is a flowchart showing the flow of the manufacturing process of the piezoelectric vibrator shown in FIG. 1.

First, as shown in FIG. 5, a piezoelectric vibrating reed manufacturing step is performed to manufacture the piezoelectric vibrating reed 5 shown in FIGS. 1 to 4 (S10). Moreover, after the piezoelectric vibrating reed 5 is manufactured, rough tuning of a resonance frequency is performed. Fine tuning of adjusting the resonance frequency more accurately is performed when a mounting step is performed.

First Wafer Manufacturing Step

Figure 6:
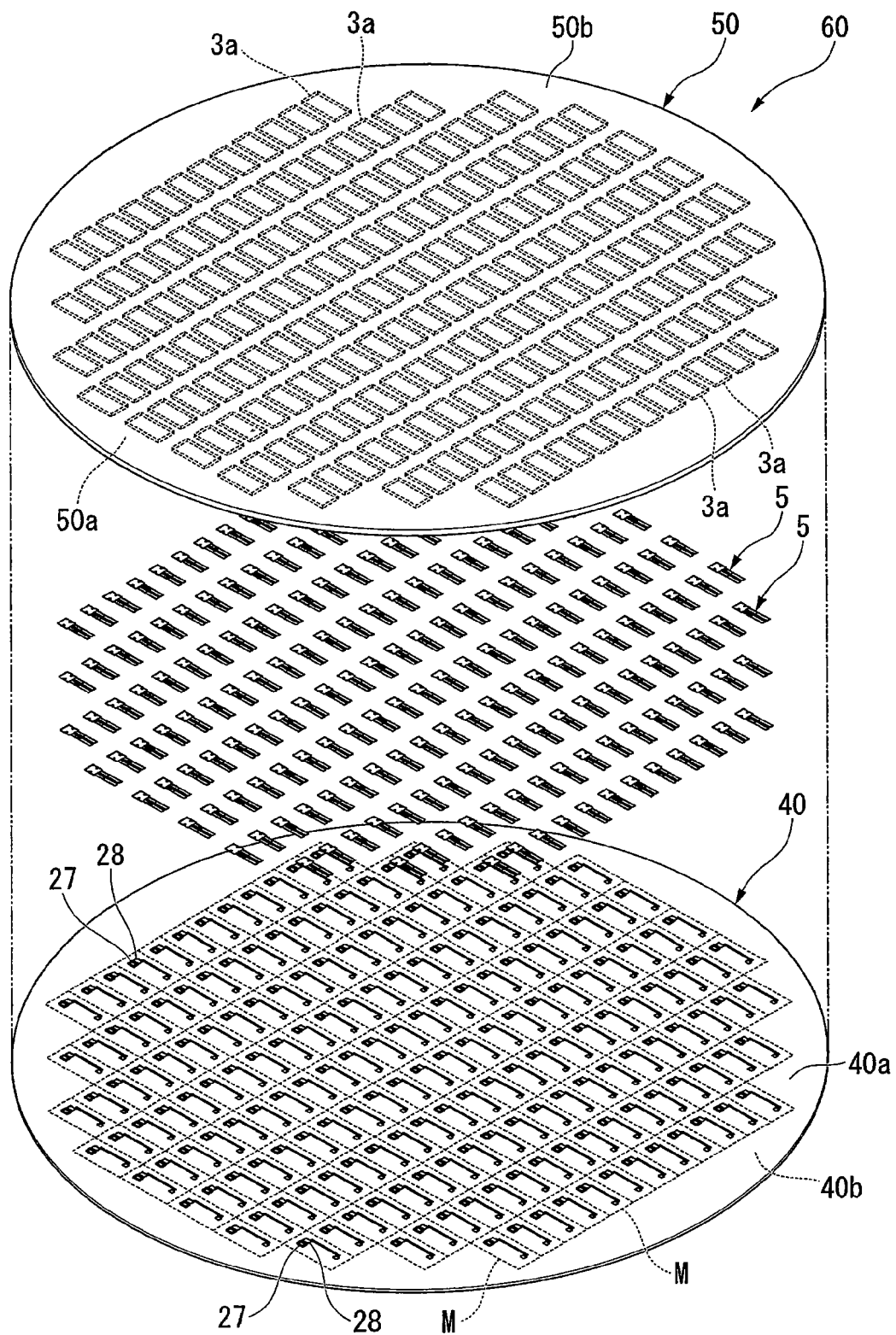
FIG. 6 is an exploded perspective view showing one step of the manufacturing process of the piezoelectric vibrator in accordance with the flowchart shown in FIG. 5, showing a wafer assembly in which the base board wafer and the lid board wafer are anodically bonded with the piezoelectric vibrating reed accommodated in the cavity.

FIG. 6 is an exploded perspective view of a wafer assembly in which a base board wafer and a lid board wafer are anodic bonding to each other with the piezoelectric vibrating reed accommodated in the cavity.

Subsequently, as shown in FIGS. 5 and 6, a first wafer manufacturing step is performed where a lid board wafer 50 later serving as the lid board 3 is manufactured up to a stage immediately before anodic bonding is achieved (S20). Specifically, a disk-shaped lid board wafer 50 is formed by polishing a soda-lime glass to a predetermined thickness, cleaning the polished glass, and removing an affected uppermost layer by etching or the like (S21). After that, a recess forming step is performed where a plurality of recess portions 3a to be used as a cavity C is formed in a matrix form on an inner end surface 50a (the lower surface in FIG. 6) of the lid board wafer 50 by etching or the like (S22).

Subsequently, in order to secure airtightness between the lid board wafer 50 and a base board wafer 40 described later, a polishing step (S23) is performed where at least the inner end surface 50a of the lid board wafer 50 serving as the bonding surface to be bonded with the base board wafer 40 is polished so that the inner end surface 50a has a mirror-like surface. In this way, the first wafer manufacturing step (S20) ends.

Second Wafer Manufacturing Step

Subsequently, at the same or a different time as the first wafer manufacturing step, a second wafer manufacturing step is performed where a base board wafer 40 later serving as the base board 2 is manufactured up to a stage immediately before anodic bonding is achieved (S30). In this step, first, a disk-shaped base board wafer 40 is formed by polishing a soda-lime glass to a predetermined thickness, cleaning the polished glass, and removing an affected uppermost layer by etching or the like (S31). After that, a through-hole forming step is performed where a plurality of through-holes 21 and 22 for disposing a pair of penetration electrodes 8 and 9 on the base board wafer 40 is formed by press working or the like (S32). Specifically, the through-holes 21 and 22 can be formed by forming recess portions on an outer end surface 40b of the base board wafer 40 by press working or the like and then polishing at least the inner end surface 40a of the base board wafer 40 so as to penetrate through the recess portions.

Subsequently, a penetration electrode forming step (S33) is performed where penetration electrodes 8 and 9 are formed in the through-holes 21 and 22 formed during the through-hole forming step (S32). By doing so, in the through-holes 21 and 22, the core portions 31 are maintained to be even with both end surfaces 40a and 40b of the base board wafer 40. In this way, the penetration electrodes 8 and 9 can be formed.

Subsequently, a bonding layer forming step is performed where a conductive material is patterned on the inner end surface 40a of the base board wafer 40 so as to form a bonding layer 23 (S34), and a lead-out electrode forming step is performed (S35). The bonding layer 23 is formed on a region of the base board wafer 40 other than the formation region of the cavity C, namely the entire bonding region of the base board wafer 40 to be bonded to the inner end surface 50a of the lid board wafer 50. In this way, the second wafer manufacturing step (S30) ends.

Subsequently, the piezoelectric vibrating reed 5 manufactured by the piezoelectric vibrating reed manufacturing step (S10) is mounted on the lead-out electrodes 27 and 28 of the base board wafer 40 manufactured by the second wafer manufacturing step (S30) with bumps B made of gold or the like disposed therebetween (S40). Then, a superimposition step is performed where the base board wafer 40 and the lid board wafer 50 manufactured by the first and second wafer manufacturing steps are superimposed onto each other (S50). Specifically, the two wafers 40 and 50 are aligned at a correct position using reference marks or the like not shown in the figure as indices. In this way, the mounted piezoelectric vibrating reed 5 is accommodated in the cavity C surrounded by the recess portion 3a formed on the lid board wafer 50 and the base board wafer 40.

After the superimposition step is performed, a bonding step is performed where anodic bonding is achieved under a predetermined temperature atmosphere with application of a predetermined voltage in a state where the two superimposed wafers 40 and 50 are inserted into an anodic bonding machine not shown and the outer peripheral portions of the wafers 40 and 50 are clamped by a holding mechanism not shown (S60). Specifically, a predetermined voltage is applied between the bonding layer 23 and the lid board wafer 50. Then, an electrochemical reaction occurs at an interface between the bonding layer 23 and the lid board wafer 50, whereby they are closely adhered tightly and anodically bonded. In this way, the piezoelectric vibrating reed 5 can be sealed in the cavity C, and a wafer assembly 60 can be obtained in which the base board wafer 40 and the lid board wafer 50 are bonded to each other. According to the present embodiment, by anodically bonding the two wafers 40 and 50, compared to the case of bonding the two wafers 40 and 50 by an adhesive or the like, it is possible to prevent positional shift due to aging or impact and warping of the wafer assembly 60 and bond the two wafers 40 and 50 more tightly.

After that, a pair of outer electrodes 6 and 7 is formed so as to be electrically connected to the pair of penetration electrodes 8 and 9 (S70), and the frequency of the piezoelectric vibrator 1 is finely tuned (S80).

Fragmentation Step

Figure 7:
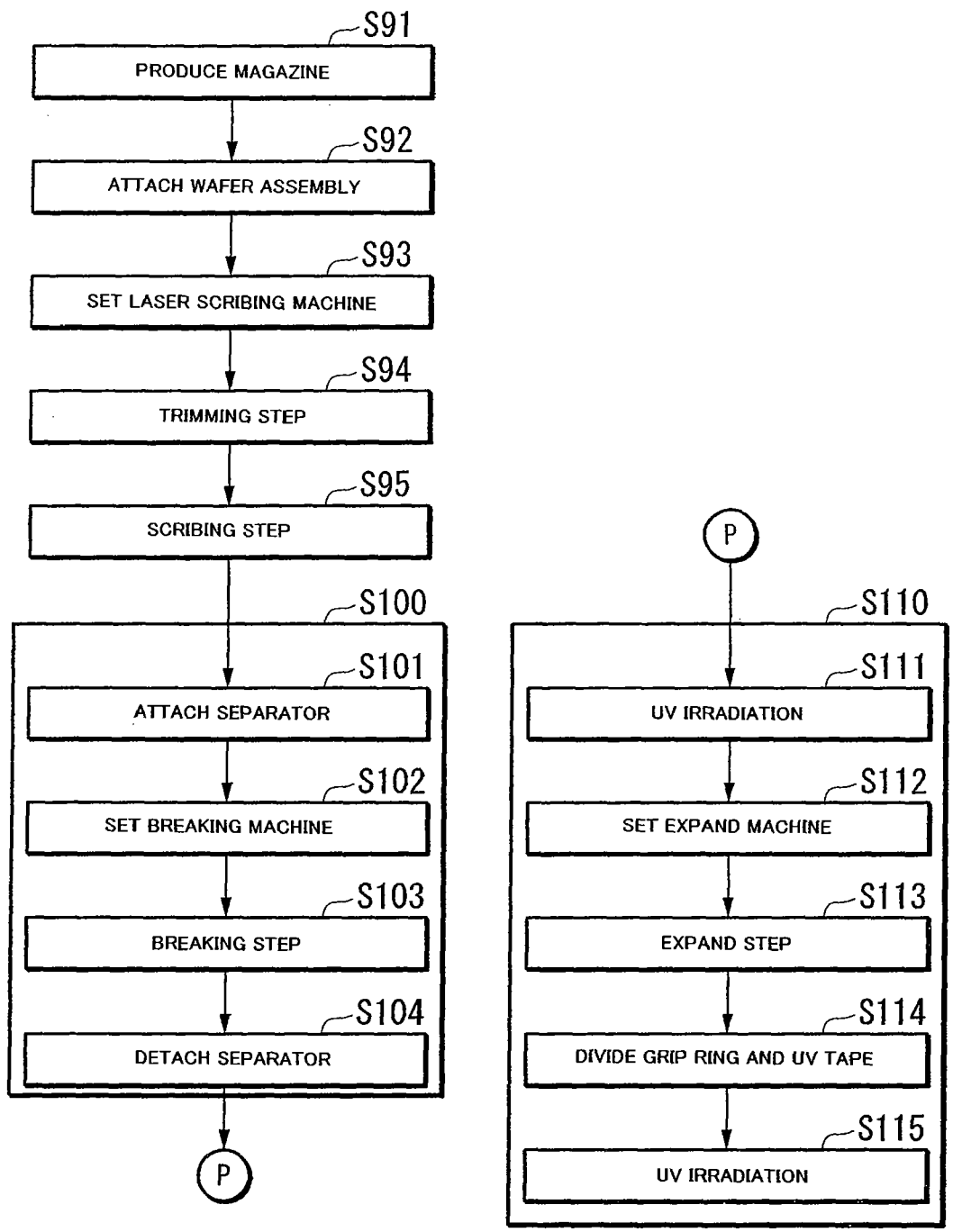
FIG. 7 is a flowchart showing the flow of a fragmentation step.

FIG. 7 is a flowchart showing the flow of a fragmentation step of the wafer assembly. FIGS. 8 to 13 are sectional views of the wafer assembly illustrating the fragmentation step.

After the fine tuning of the frequency is completed, a fragmentation step is performed where the bonded wafer assembly 60 is cut into small fragments (S90).

Figure 8:
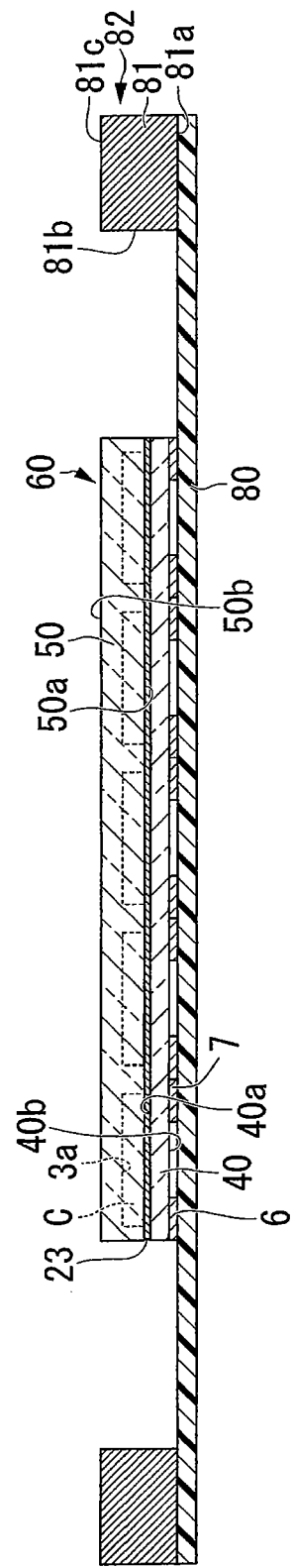
FIG. 8 is a sectional view illustrating the fragmentation step, showing a state where the wafer assembly is held on a magazine.

In the fragmentation step (S90), as shown in FIGS. 7 and 8, a magazine 82 for holding the wafer assembly 60 is produced using a UV tape 80 and a ring frame 81 (S91). The ring frame 81 is a ring-shaped member whose inner diameter is larger than the diameter of the wafer assembly 60 and has the same thickness (the length in the axial direction thereof) as the wafer assembly 60. The UV tape 80 is a polyolefin sheet coated with UV-curable resin, for example, acrylic adhesive, and specifically, UHP-1525M3 available from Denki Kagaku Kogyo K.K., D510T available from Lynntech Inc., and the like are suitably used. The thickness of the UV tape 80 is preferably 160 μm or larger and 180 μm or smaller, and in the present embodiment, a thickness of about 175 μm is suitably used.

The magazine 82 can be produced by attaching the UV tape 80 on one surface 81a of the ring frame 81 so as to close a penetration hole 81b. The wafer assembly 60 is attached to an adhesion surface of the UV tape 80 in a state where the central axis of the ring frame 81 is identical to the central axis of the wafer assembly 60 (S92). Specifically, the outer end surface 40b side (the outer electrode side) of the base board wafer 40 is attached to the adhesion surface of the UV tape 80. In this way, the wafer assembly 60 is set within the penetration hole 81b of the ring frame 81. In this state, the wafer assembly 60 is transferred to a laser scribing machine (not shown) (S93).

Figure 14:
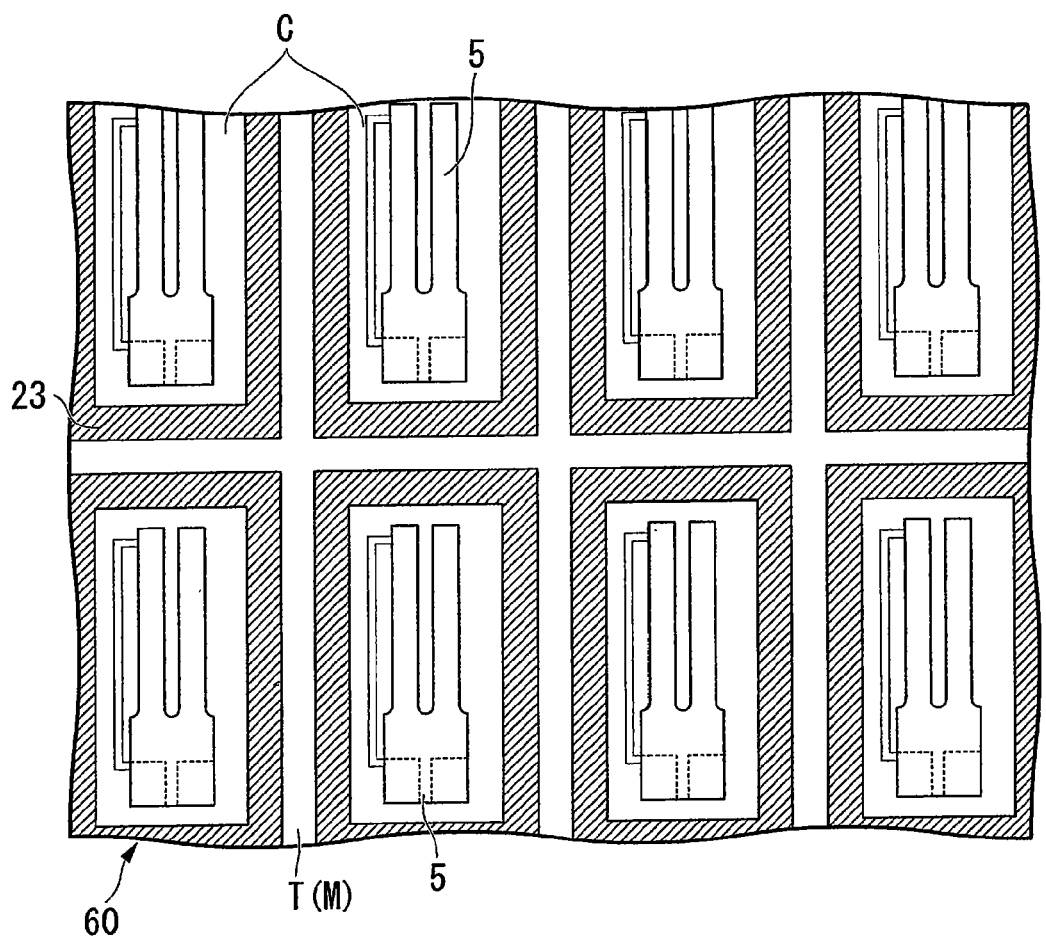
FIG. 14 is a top view illustrating a trimming step, showing a base board wafer of the wafer assembly with a lid board wafer removed.

FIG. 14 is a top view illustrating a trimming step, showing the base board wafer of the wafer assembly with the lid board wafer removed.

Figure 9:
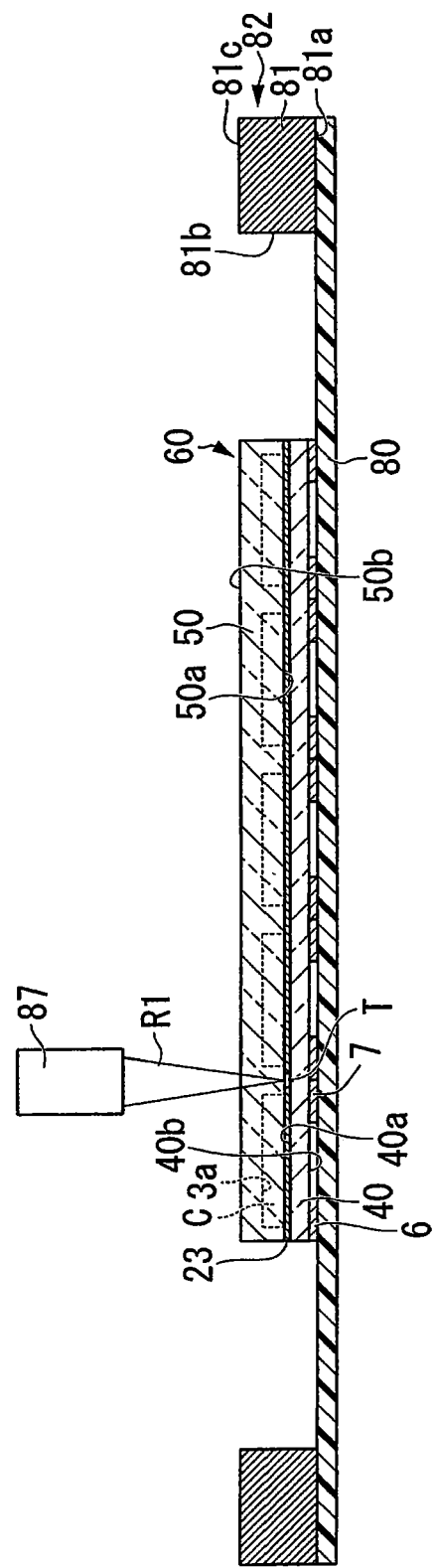
FIG. 9 is a sectional view illustrating the fragmentation step, showing a state where the wafer assembly is held on the magazine.

As shown in FIGS. 9 and 14, a trimming step is performed where the bonding layer 23 bonding the lid board wafer 50 and the base board wafer 40 together is delaminated (S94). In the trimming step (S94), the bonding layer 23 in the irradiation region of a laser beam R1 is melted using a laser source that emits light having an absorption wavelength of the bonding layer 23, for example, a first laser source 87 configured by a second-harmonic laser source having a wavelength of 532 nm. In this case, the laser beam R1 emitted from the first laser source 87 is reflected by a beam scanner (galvanometer) and is then focused through an FO lens. The first laser source 87 is moved in parallel and relative to the wafer assembly 60 while irradiating the focused laser beam R1 from a side of the wafer assembly 60 close to the outer end surface 50b (one surface) of the lid board wafer 50. Specifically, the first laser source 87 is scanned on partition walls that divide the cavities C, namely along the contour line (intended cutting line) M (see FIG. 6) of the piezoelectric vibrator 1.

The spot diameter of the laser beam R1 in the trimming step (S94) is set to 10 μm or more and 30 μm or less, for example. As the other conditions of the trimming step (S94), it is preferable that an average output at the processing point of the first laser source 87 is set to 1.0 W, and a frequency modulation amplitude and a scanning speed are set to about 20 kHz and 200 mm/sec, respectively, for example.

In this way, the bonding layer 23 on the contour line M is heated by absorbing the laser beam R1, whereby the bonding layer 23 is melted and contracted towards the outer side from the irradiation region (contour line M) of the laser beam R1. As a result, a trimming line T where the bonding layer 23 is delaminated from the bonding surface is formed on the bonding surfaces of the two wafers 40 and 50 (the inner end surface 50a of the lid board wafer 50 and the inner end surface 40a of the base board wafer 40).

Figure 10:
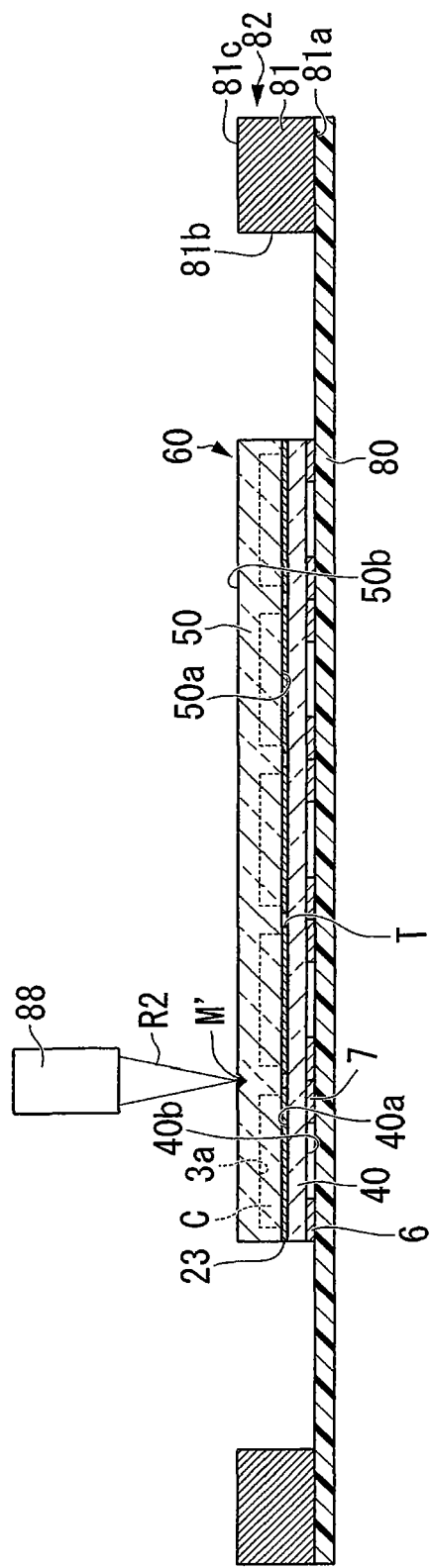
FIG. 10 is a sectional view illustrating the fragmentation step, showing a state where the wafer assembly is held on the magazine.

Subsequently, as shown in FIG. 10, a surface layer portion of the outer end surface 50b of the lid board wafer 50 is irradiated with a laser beam R2 to form a scribe line M' on the wafer assembly 60 (S95: scribing step). In the scribing step (S95), the surface layer portion of the lid board wafer 50 in the laser irradiation region is melted using a laser source that emits light having an absorption wavelength of the lid board wafer 50 (soda-lime glass), for example, a second laser source 88 configured by a UV-Deep laser having a wavelength of 266 nm. Specifically, similar to the trimming step (S94), the second laser source 88 is moved in parallel and relative to the wafer assembly 60, and the second laser source 88 is scanned along the contour line M of the piezoelectric vibrator 1. By doing so, the surface layer portion of the lid board wafer 50 is heated by absorbing the laser beam R2, whereby the lid board wafer 50 is melted and the scribe line M' having a V-groove form is formed. As described above, the first laser source 87 and the second laser source 88 are scanned along the contour line M of each piezoelectric vibrator 1. In this way, the trimming line T where the bonding layer 23 is delaminated and the scribe line M' are arranged so that they overlap with each other as viewed from the thickness direction of the wafer assembly 60.

Figure 15:
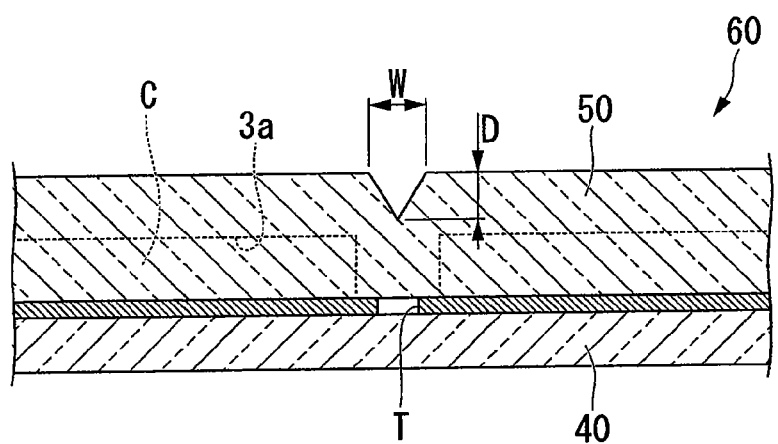
FIG. 15 is a sectional view showing the wafer assembly after a scribing step.

FIG. 15 is a sectional view showing the wafer assembly after the scribing step.

As shown in FIG. 15, assuming that the width dimension of the scribe line M' is W and the depth dimension thereof is D, the scribe line M' of the present embodiment is preferably formed so that the ratio of the depth dimension D to the width dimension W is 0.8 or larger and 6.0 or smaller (W:D=1:0.8 to 6.0). According to the present embodiment, when the scribe line M' is formed by the second laser source 88, the width dimension W can be adjusted by the spot diameter of the laser beam R2, and the depth dimension D can be adjusted by the laser irradiation time (the amount of energy applied to the wafer assembly 60) of the laser beam R2.

If the depth dimension D of the scribe line M' is too much larger than the width dimension W (the ratio of the depth dimension D to the width dimension W is larger than 6.0), the amount of energy that the second laser source 88 applies to the wafer assembly 60 becomes too large, and thus the wafer assembly 60 will be damaged greatly. As a result, the wafer assembly 60 may be crashed during a fragmentation step (S90) described later. Moreover, there is a problem in that the laser irradiation time of the laser beam R2 increases, and thus, the manufacturing efficiency decreases. On the other hand, if the depth dimension D of the scribe line M' is too much smaller than the width dimension W (the ratio of the depth dimension D to the width dimension W is smaller than 0.8), there is a problem in that the scribe line M' does not serve as the breaking starting point at the time of applying a breaking stress, and the wafer assembly 60 is hardly broken.

Therefore, the scribe line M' of the present embodiment is formed so that the width dimension W is about 14 μm and the depth dimension D is about 11 μm. It is more preferable that the depth dimension D is set to be equal to the width dimension W. As other conditions of the scribing step (S95), it is preferable that an output at the processing point of the second laser source 88 is set to 250 mW to 600 mW, and pulse energy to 100 μJ, processing threshold fluence to 30 J/(cm² pulse), and scanning speed to about 40 mm/sec to 60 mm/sec, for example.

Subsequently, a cutting step is performed where the wafer assembly 60 on which the scribe line M' is formed is cut into individual piezoelectric vibrators 1 (S100).

Figure 11:
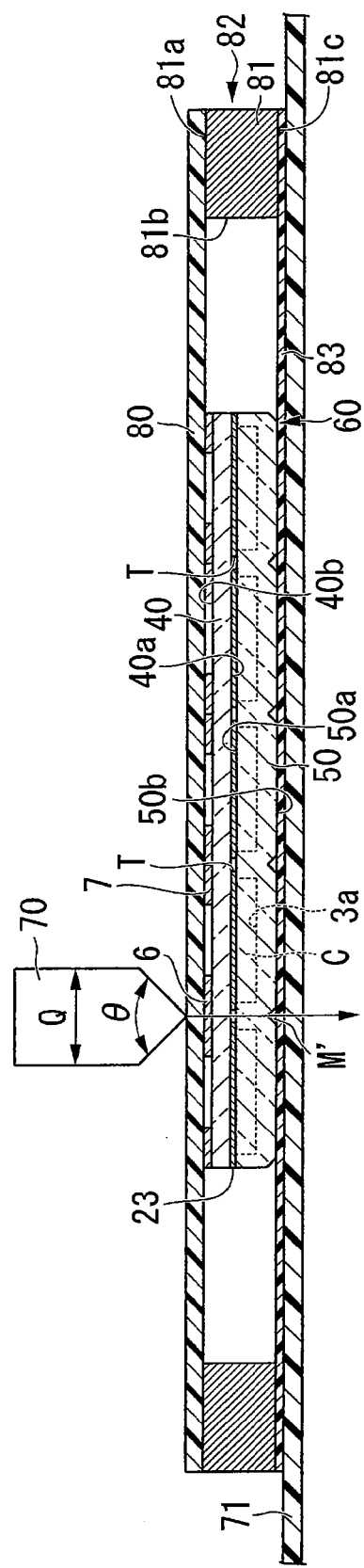
FIG. 11 is a sectional view illustrating the fragmentation step, showing a state where the wafer assembly is held on the magazine.

In the cutting step (S100), first, as shown in FIG. 11, a separator (protection film) 83 is attached to the other surface 81c of the ring frame 81 so as to close the penetration hole 81b (S101). The separator 83 protects the outer end surface 50b of the lid board wafer 50 in a breaking step (S103) and is formed to a thickness of 20 μm or more and 30 μm or less by a polyethylene terephthalate film (so-called PET film) or the like. If the thickness of the separator 83 is smaller than 20 μm, it is not desirable because the separator 83 may be cut together with the wafer assembly 60 in the breaking step (S103) described later. On the other hand, if the thickness of the separator 83 is larger than 30 μM, it is not desirable because the breaking stress acting on the wafer assembly 60 during the breaking step (S103) may be reduced by the separator 83, and thus, the wafer assembly 60 is not cut smoothly, and the surface precision of the cutting surface decreases.

The wafer assembly 60 is held within the penetration hole 81*b* of the ring frame 81 in a state of being sandwiched between the UV tape 80 and the separator 83. In this state, the wafer assembly 60 is transferred to a breaking machine (S102).

Subsequently, a breaking step is performed where a breaking stress is applied to the wafer assembly 60 transferred to the breaking machine (S103). In the breaking step (S103), a cutting blade 70 whose blade length is larger than the diameter of the wafer assembly 60 is prepared. Then, the cutting blade 70 is positioned on the scribe line M' (the trimming line T) from the side of the outer end surface 40*b* (the other surface) of the base board wafer 40, and the blade edge of the cutting blade 70 is brought into contact with the outer end surface 40*b* of the base board wafer 40. After that, a predetermined breaking stress (for example, 10 kg/inch) is applied to the wafer assembly 60 along the thickness direction (contour line M) of the wafer assembly 60. In FIG. 11, reference numeral 71 is a silicon rubber (for example, having a thickness of about 2 mm) of the breaking machine on which the wafer assembly 60 is set.

Meanwhile, in the breaking step (S103) of the present embodiment, in order to cut the relatively thick wafer assembly 60 in which two board wafers 40 and 50 are laminated, it is necessary to apply a large breaking stress of about 10 kg/inch, fOr example, to the wafer assembly 60.

Figure 19:
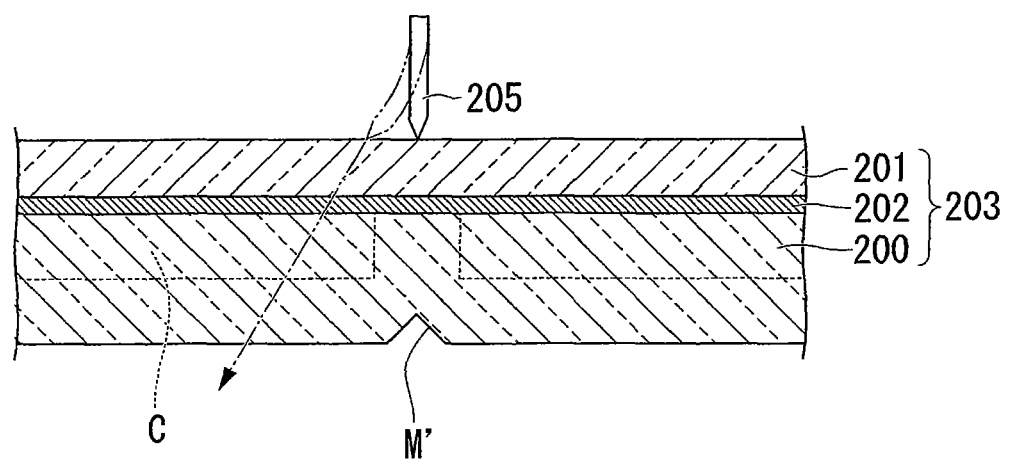
FIG. 19 is a sectional view of a wafer assembly illustrating a cutting step according to the related art.

Therefore, the cutting blade 70 of the present embodiment is preferably formed so that a base thickness Q of the cutting blade 70 is about 10 mm, and a blade edge angle θ is 80° or larger and 100° or smaller. If the blade edge angle θ of the cutting blade is too small (the blade edge angle θ is smaller than 80°), it is not desirable because the slip phenomenon illustrated in FIG. 19 may take place. On the other hand, if the blade edge angle θ of the cutting blade is too large (the blade edge angle θ is larger than)100°, it may be unable to concentrate the breaking stress on the wafer assembly even when the cutting blade is brought into contact with the wafer assembly during the breaking step (S103), and the wafer assembly is destroyed (crashed) in pieces.

Specifically, the blade edge angle θ of the cutting blade 70 of the present embodiment is about 90°, and a tip end of the blade edge has a curved shape whose radius of curvature is about 10 μm.

When a breaking stress is applied to the wafer assembly 60 via the cutting blade 70, the cutting blade 70 will not be bent, and the breaking stress will be effectively transmitted along the thickness direction of the wafer assembly 60. Therefore, a crack is formed on the wafer assembly 60 along the thickness direction from the contour line M, and the wafer assembly 60 is cut in such a way that it is divided along the scribe line M' formed on the lid board wafer 50. By pressing the cutting blade 70 on each scribe line M', it is possible to divide the wafer assembly 60 into packages for each contour line M at once. After that, the separator 83 attached to the wafer assembly 60 is detached (S104). According to the present embodiment, by applying the breaking stress along the scribe line M' from the side opposite to the formation region of the scribe line M', namely the outer end surface 40*b* of the base board wafer 40 during the breaking step (S103), it is possible to generate a large breaking stress on the bottom of the scribe line M'. Therefore, it is possible to cut the wafer assembly 60 in a smoother and easier manner. Therefore, a cutting surface having considerably better surface precision can be obtained. In addition, the breaking stress is a tensional stress that is generated in the direction away from the scribe line M (the direction where the piezoelectric vibrators 1 are separated from each other).

Subsequently, a pickup step for picking up the fragmented piezoelectric vibrators 1 is performed (S110). In the pickup step (S110), first, a UV beam is irradiated onto the UV tape 80 of the magazine 82 to slightly decrease the adhesive force of the UV tape 80 (S111). In this state, the wafer assembly 60 is still attached to the UV tape 80.

Figure 12:
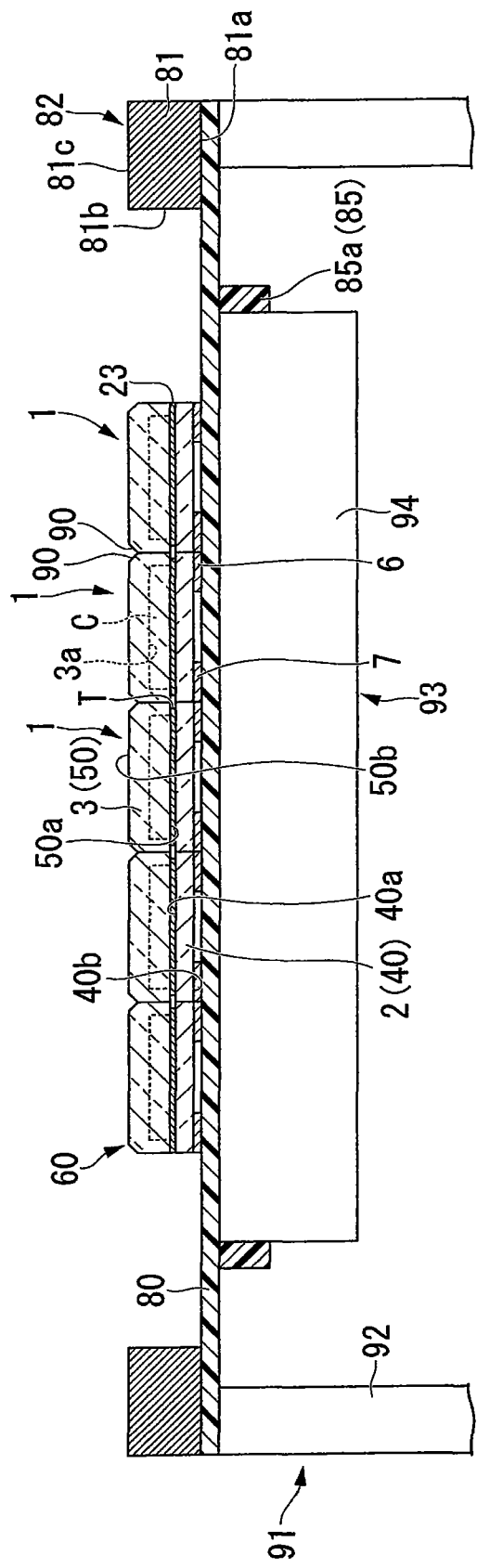
FIG. 12 is a sectional view illustrating the fragmentation step, showing a state where the wafer assembly is held on the magazine.

Subsequently, in order to perform an expand step (S113) described later, as shown in FIG. 12, the wafer assembly 60 is transferred to an expand machine 91 (S112). First, the expand machine 91 will be described.

The expand machine 91 includes an annular base ring 92 on which the ring frame 81 is set, and a disk-shaped heater panel 93 which is disposed at an inner side of the base ring 92 and has a larger diameter than the wafer assembly 60. The heater panel 93 is configured by a base plate 94 on which the wafer assembly 60 is set, and a heat-transfer heater (not shown) mounted on the base plate 94, and is disposed such that the central axis of the heater panel 93 is identical to the central axis of the base ring 92. In addition, the heater panel 93 is configured to be movable along the axial direction by a drive means not shown. Although not shown in the figure, the expand machine 91 is also provided with a pressing member that clamps the ring frame 81 set on the base ring 92 between the base ring 92 and the pressing member.

When the expand step (S113) is performed using such a machine, first, an inner ring 85*a* of a grip ring 85 described later is set at an outer side of the heater panel 93 before the wafer assembly 60 is set on the expand machine 91. At that time, the inner ring 85*a* is fixed to the heater panel 93 and set so as to be moved together when the heater panel 93 is moved. The grip ring 85 is a ring made of resin whose inner diameter is larger than the outer diameter of the heater panel 93 and smaller than the inner diameter of the penetration hole 81*b* of the ring frame 81. The grip ring 85 is configured by the inner ring 85*a* and an outer ring 85*b* (see FIG. 13) whose inner diameter is the same as the outer diameter of the inner ring 85*a*. That is, the inner ring 85*a* is stuck at the inner side of the outer ring 85*b*.

After that, the wafer assembly 60 fixed to the magazine 82 is set on the expand machine 91. At that time, the wafer assembly 60 is set with the side of the UV tape 80 facing the heater panel 93 and the base ring 92. Specifically, the wafer assembly 60 is set on the expand machine 91 in a state where the outer end surface 40*b* of the wafer assembly 60 opposes the heater panel 93, and the one surface 81*a* of the ring frame 81 opposes the base ring 92. In this way, the wafer assembly 60 is set on the heater panel 93 with the UV tape 80 disposed therebetween. Moreover, the ring frame 81 is clamped between the base ring 92 and the pressing member not shown.

Figure 13:
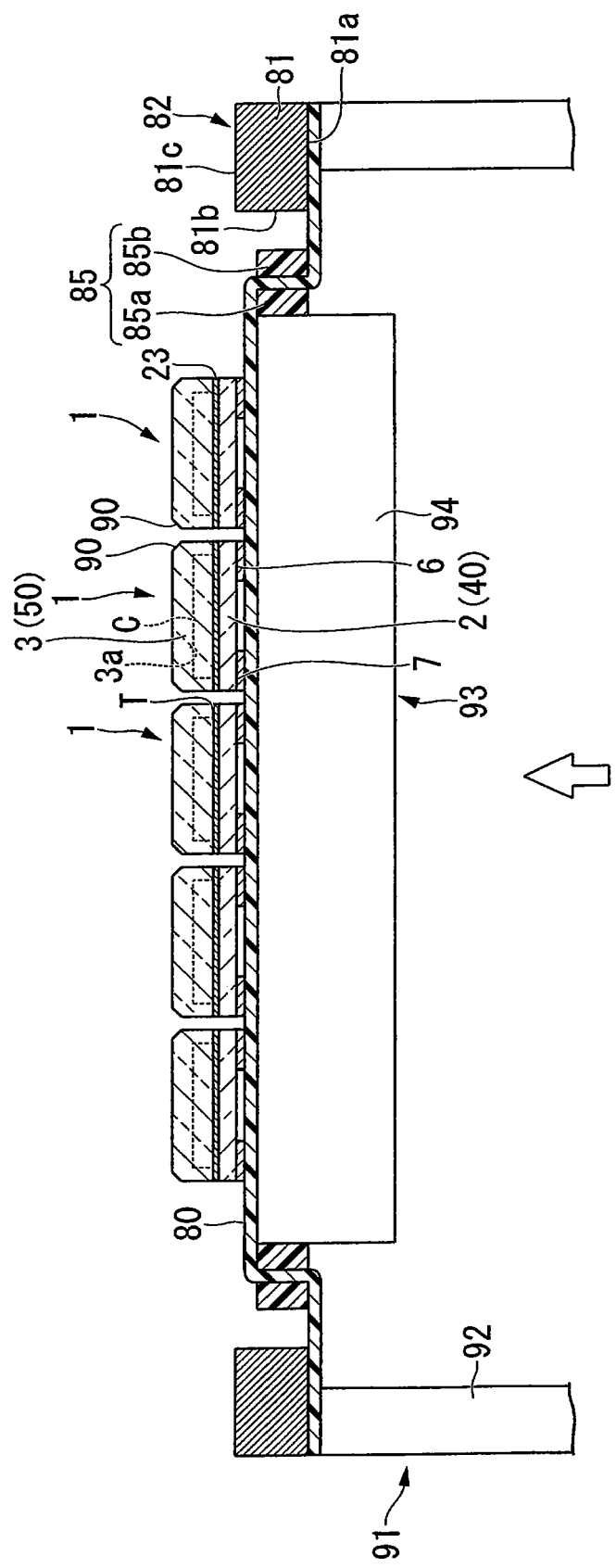
FIG. 13 is a sectional view illustrating the fragmentation step, showing a state where the wafer assembly is held on the magazine.

Subsequently, the UV tape 80 is heated to a temperature of 50° C. or higher by the heater of the heater panel 93. By heating the UV tape 80 to a temperature of 50° C. or higher, the UV tape 80 softens to be easily expanded. As shown in FIG. 13, the heater panel 93 is raised together with the inner ring 85*a* (see the arrow in FIG. 13) with the UV tape 80 heated. At that time, since the ring frame 81 is clamped between the base ring 92 and the pressing member, the UV tape 80 is expanded toward the outer side in the diameter direction of the wafer assembly 60. By doing so, the piezoelectric vibrators 1 attached to the UV tape 80 are separated, and the space between the adjacent piezoelectric vibrators 1 increases. In this state, the outer ring 85b is set at the outer side of the inner ring 85a. Specifically, the inner ring 85a and the outer ring 85b are fitted to each other with the UV tape 80 interposed therebetween. In this way, the UV tape 80 in the expanded state is held on the grip ring 85. Moreover, the UV tape 80 at the outer side of the grip ring 85 is cut, and the ring frame 81 and the grip ring 85 are divided (S114).

After that, a UV beam is irradiated onto the UV tape 80 again so as to further decrease the adhesive force of the UV tape 80 (S115: UV irradiation step). In this way, the piezoelectric vibrators 1 are separated from the UV tape 80. Thereafter, the piezoelectric vibrators 1 are sucked by a nozzle or the like while detecting the positions thereof by image recognition or the like, whereby the piezoelectric vibrators 1 separated from the UV tape 80 are picked out. In this way, by irradiating the UV beam onto the UV tape 80 to separate the piezoelectric vibrators 1 from the UV tape 80, it is possible to pick out the fragmented piezoelectric vibrators 1. In the present embodiment, in order to achieve fragmentation along the scribe line M' of the lid board wafer 50 during the breaking step (S103), chamfered portion 90 in which C-chamfering is achieved by the scribe line M' are formed on the upper peripheral edge of the lid board 3 of the fragmented piezoelectric vibrator 1.

In this way, a plurality of two-layered SMD-type piezoelectric vibrators 1 shown in FIG. 1, in which the piezoelectric vibrating reed 5 is sealed in the cavity C formed between the base board 2 and the lid board 3 being anodically bonded together, can be manufactured at a time.

Subsequently, as shown in FIG. 5, an inner electrical property test is conducted (S120). That is, the resonance frequency, resonance resistance value, drive level properties (the excitation power dependence of the resonance frequency and the resonance resistance value), and the like of the piezoelectric vibrating reed 5 are measured and checked. Moreover, the insulation resistance properties and the like are checked as well. Finally, an external appearance test of the piezoelectric vibrator 1 is conducted to check the dimensions, the quality, and the like. In this way, the manufacturing of the piezoelectric vibrator 1 ends.

As described above, in the present embodiment, during the scribing step (S95), the scribe line M' is formed so that the ratio of the depth dimension D to the width dimension W is 0.8 or larger and 6.0 or smaller.

According to this configuration, by forming the scribe line M' on the surface layer portion of the lid board wafer 50 along the contour line M prior to the breaking step (S103), it is possible to provide merits such as, for example, a very small cutting zone, a high cutting speed, good surface precision of the cutting surface, and less chipping, as compared with the blade cutting method of the related art.

Particularly, since the scribe line M' is formed so that the ratio of the depth dimension D to the width dimension W is 0.8 or larger, the scribe line M' serves as the cutting starting point in the breaking step (S103), and it is possible to facilitate the progress of cracking in the thickness direction of the wafer assembly 60.

On the other hand, since the scribe line M' is formed so that the ratio of the depth dimension D to the width dimension W is 6.0 or smaller, it is not necessary to irradiate an excessive amount of laser beam R2, and thus the damage on the wafer assembly 60 resulting from the laser irradiation by the second laser source 88 during the scribing step (S95) can be suppressed. As a result, it is possible to prevent crashing during the breaking step (S103). In addition, it is possible to shorten the laser irradiation time of the laser beam R2 and improve the manufacturing efficiency. The present inventor conducted a bending test (for example, amplitude of 3 mm) on the wafer assembly 60 after the scribing step (S95) and before the breaking step (S103). However, in the bending test, no cracks or damage were detected in the wafer assembly 60.

Therefore, since the wafer assembly 60 can be cut along the contour line M in a smooth and easy manner, it is possible to improve the surface precision of the cutting surface and prevent breaking or the like of the wafer assembly 60 during breaking, thus cutting the wafer assembly 60 to a desired size. In this way, it is possible to secure airtightness of the cavity C and provide the piezoelectric vibrator 1 having excellent vibration characteristics and high reliability.

Therefore, it is possible to increase the number of piezoelectric vibrators 1 picked out as non-defective products from one wafer assembly 60 and thus to improve yield.

In addition, in the present embodiment, the blade edge angle θ of the cutting blade 70 is set to 80° or larger and 100° or smaller.

According to this configuration, since the blade edge angle θ is set to 800 or larger, the above-described slip phenomenon will not take place when the breaking stress is applied to the wafer assembly 60, and thus the breaking stress can be effectively applied along the contour line M. Therefore, it is possible to facilitate the progress of cracking in the thickness direction of the wafer assembly 60.

On the other hand, since the blade edge angle θ is set to 100° or smaller, the breaking stress can be concentrated on the wafer assembly 60, and the above-described crashing can be prevented.

Therefore, it is possible to cut the wafer assembly 60 in a smooth and easy manner and obtain a cutting surface having better surface precision.

In addition, since the thickness of the separator 83 is 20 μm or more, the separator 83 will not be cut together with the wafer assembly 60 during the breaking step (S103).

On the other hand, since the thickness of the separator 83 is 30 μm or less, the breaking stress acting on the wafer assembly 60 will not be reduced by the separator 83, and accordingly, the wafer assembly 60 can be cut in a smoother and easier manner.

Since the bonding layer 23 on the contour line M is delaminated to form the trimming line T prior to the scribing step (S95), it is possible to facilitate the progress of cracking in the thickness direction of the wafer assembly 60 during the breaking and prevent the progress of cracking in the surface direction of the wafer assembly 60.

In addition, the lid board 3 of the piezoelectric vibrator 1 according to the present embodiment is formed with the chamfered portions 90 on the peripheral portion thereof.

According to this configuration, even when a mechanism for picking out the piezoelectric vibrator 1 comes into contact with the corners of the piezoelectric vibrator 1 during the pickup step (S110) when the fragmented piezoelectric vibrators 1 are picked out, since it is possible to suppress generation of chippings associated with contacting, the piezoelectric vibrators 1 can be picked out easily.

Moreover, the chamfered portions 90 can be formed automatically by cutting along the scribe line M' after forming the scribe line M' with laser irradiation of the second laser source 88. Therefore, it is possible to form the chamfered portions 90 more quickly and easily compared with the case of forming the chamfered portions 90 in the respective cut piezoelectric vibrators 1. As a result, it is possible to improve workability.

Furthermore, by cutting the wafer assembly 60 along the scribe line M', it is possible to improve the cutting precision of the cutting surface of the piezoelectric vibrator 1 and provide the piezoelectric vibrator 1 having high reliability.

Oscillator

Next, an oscillator according to an embodiment of the present invention will be described with reference to FIG. 16.

Figure 16:
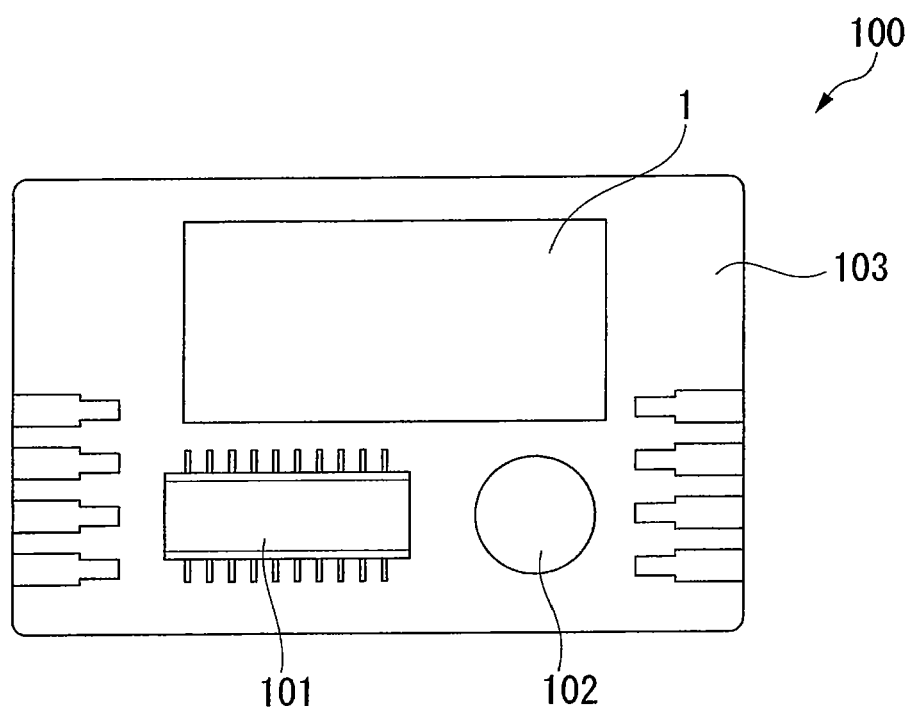
FIG. 16 is a view showing the configuration of an oscillator according to an embodiment of the present invention.

As shown in FIG. 16, an oscillator 100 of the present embodiment is one in which the piezoelectric vibrator 1 is configured as an oscillating piece that is electrically connected to an integrated circuit 101. The oscillator 100 includes a board 103 on which an electronic component 102 such as a capacitor is mounted. The integrated circuit 101 for the oscillator is mounted on the board 103, and the piezoelectric vibrator 1 is mounted in the vicinity of the integrated circuit 101. The electronic component 102, the integrated circuit 101, and the piezoelectric vibrator 1 are electrically connected by a wiring pattern which is not shown. It should be noted that these components are molded by resin which is not shown.

In the oscillator 100 configured in this manner, the piezoelectric vibrating reed 5 in the piezoelectric vibrator 1 vibrates when a voltage is applied to the piezoelectric vibrator 1. This vibration is converted to an electrical signal by the piezoelectric properties of the piezoelectric vibrating reed 5 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

By selectively setting the configuration of the integrated circuit 101, for example, an RTC (Real Time Clock) module, according to the demands, it is possible to add a function of controlling the date or time for operating the device or an external device or providing the time or calendar other than a single-function oscillator for a timepiece.

According to the oscillator 100 of the present embodiment, since the oscillator includes the piezoelectric vibrator 1 having improved quality, it is possible to achieve an improvement in the quality of the oscillator 100 itself. In addition to this, it is possible to obtain a highly accurate frequency signal which is stable over a long period of time.

Electronic Device

Figure 17:
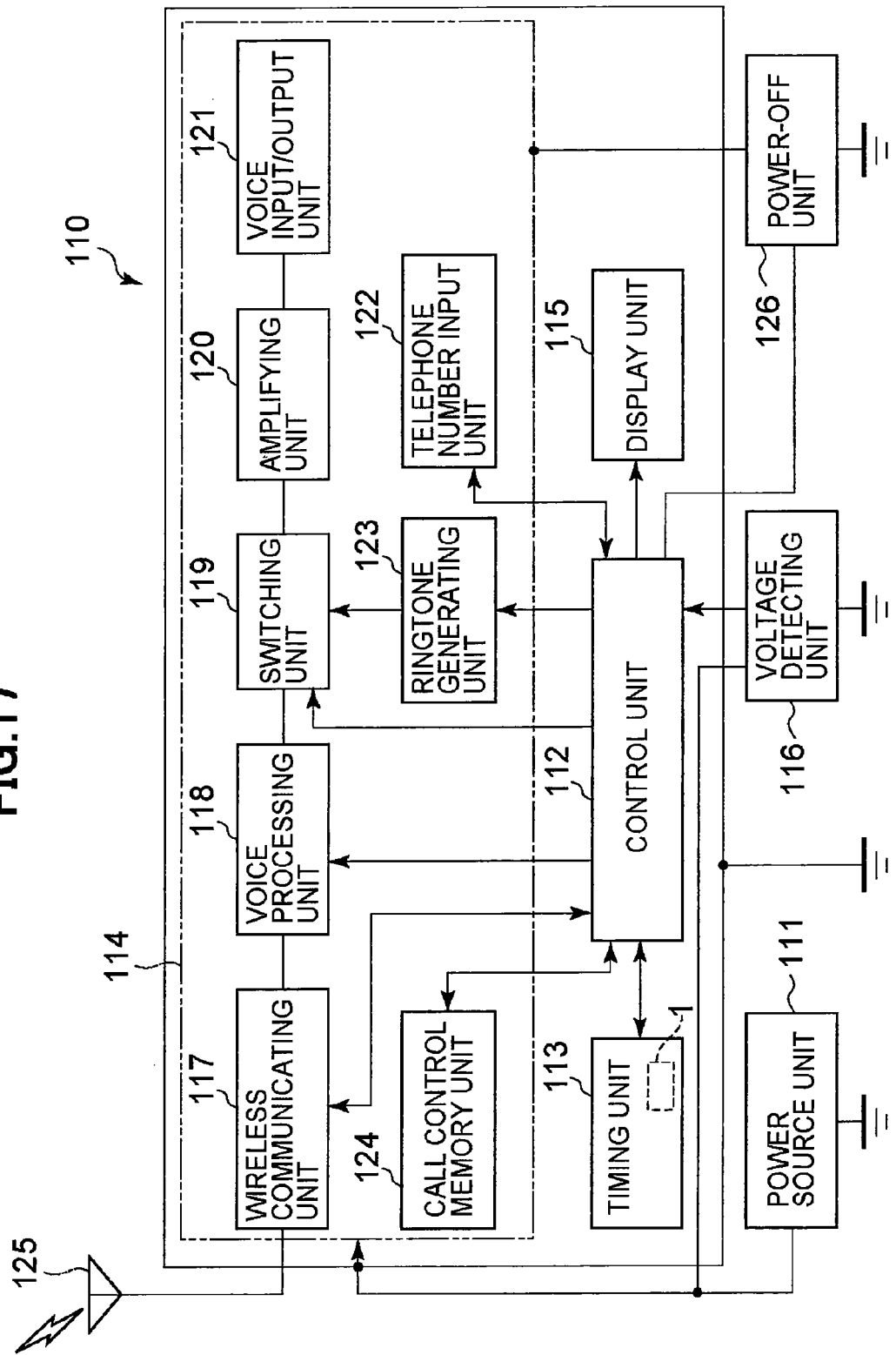
FIG. 17 is a view showing the configuration of an electronic device according to an embodiment of the present invention.

Next, an electronic device according to an embodiment of the present invention will be described with reference to FIG. 17. The present embodiment will be described by way of an example of a portable information device 110 having the piezoelectric vibrator 1 as an example of the electronic device. First, the portable information device 110 of the present embodiment is represented, for example, by a cellular phone and is one that developed and improved a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and performs communication as with a cellular phone of the related art using the internal speaker and microphone on the inner side of its strap. However, the portable information device 110 is remarkably small and light compared with the cellular phone of the related art.

Next, the configuration of the portable information device 110 of the present embodiment will be described. As shown in FIG. 17, the portable information device 110 includes the piezoelectric vibrator 1 and a power supply portion 111 for supplying power. The power supply portion 111 is formed, for example, of a lithium secondary battery. The power supply portion 111 is connected in parallel to a control portion 112 that performs various kinds of control, a timer portion 113 that counts the time or the like, a communication portion 114 that performs communication with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall system, such as operations to transmit and receive sound data and operations to count and display the current time. The control portion 112 includes a ROM in which a program is written in advance, a CPU that reads out and runs the program written to the ROM, a RAM used as a work area of the CPU, and the like.

The timer portion 113 includes an integrated circuit enclosing an oscillation circuit, a register circuit, a counter circuit, and an interface circuit, and the like as well as the piezoelectric vibrator 1. When a voltage is applied to the piezoelectric vibrator 1, the piezoelectric vibrating reed 5 vibrates, and this vibration is converted to an electrical signal by the piezoelectric characteristics of the quartz and is input to the oscillation circuit as the electrical signal. The output of the oscillation circuit is converted to a digital form and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, a sound processing portion 118, a switching portion 119, an amplifier portion 120, a sound input/output portion 121, a telephone number input portion 122, a ring tone generation portion 123, and a call control memory portion 124.

The wireless portion 117 carries out transmission and reception of various kinds of data, such as sound data, with the base station via an antenna 125. The sound processing portion 118 encodes and decodes a sound signal input therein from the wireless portion 117 or the amplifier portion 120. The amplifier portion 120 amplifies a signal input therein from the sound processing portion 118 or the sound input/output portion 121 to a predetermined level. The sound input/output portion 121 is formed of a speaker and a microphone, and makes a ring tone and an incoming sound louder, as well as collecting sounds.

The ring tone generation portion 123 generates a ring tone in response to a call from the base station. The switching portion 119 switches the amplifier portion 120 normally connected to the sound processing portion 118 to the ring tone generation portion 123 only when a call arrives, so that the ring tone generated in the ring tone generation portion 123 is output to the sound input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, is about 3 V. Upon receipt of a notification of a voltage drop from the voltage detection portion 116, the control portion 112 disables the operation of the wireless portion 117, the sound processing portion 118, the switching portion 119, and the ring tone generation portion 123. In particular, it is essential to stop the operation of the wireless portion 117 that consumes a large amount of power. Furthermore, a message informing that the communication portion 114 is unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the portable information device 110 of the present embodiment, since the portable information device includes the piezoelectric vibrator 1 having improved quality, it is possible to achieve an improvement in the quality of the portable information device itself. In addition to this, it is possible to display highly accurate clock information which is stable over a long period of time.

Radio-Controlled Timepiece

Next, a radio-controlled timepiece according to an embodiment of the present invention will be described with reference to FIG. 18.

Figure 18:
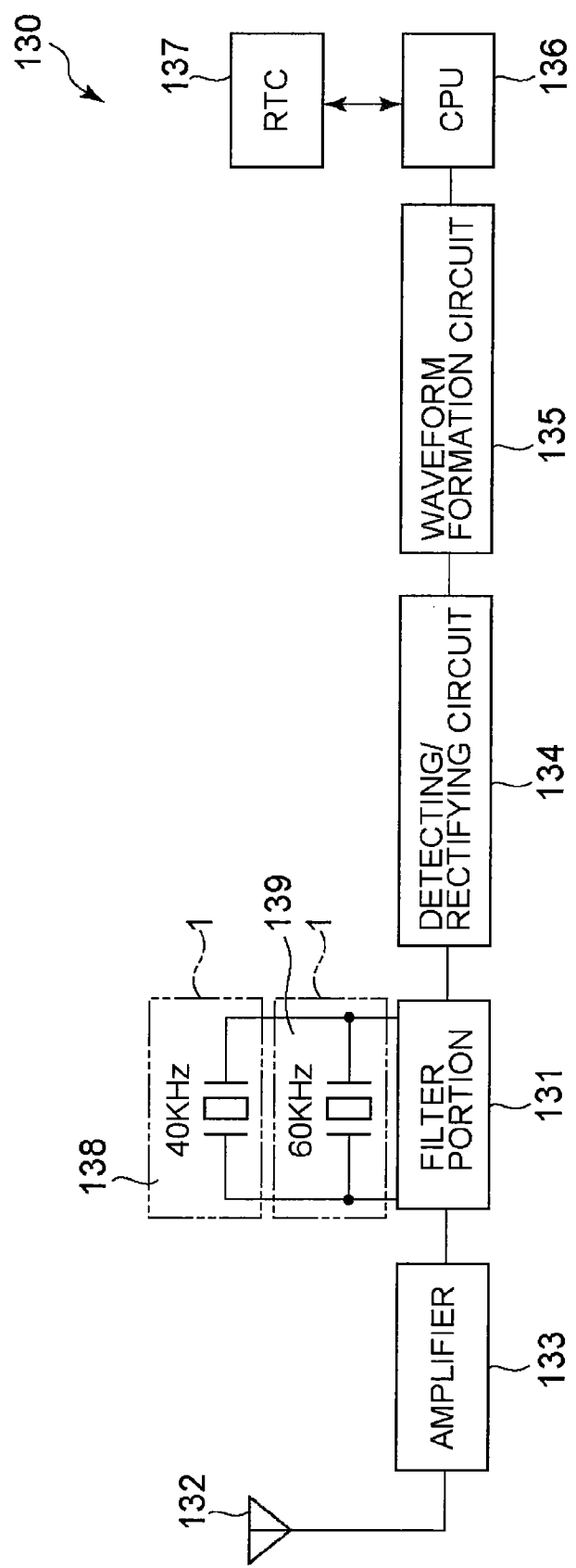
FIG. 18 is a view showing the configuration of a radio-controlled timepiece according to an embodiment of the present invention.

As shown in FIG. 18, a radio-controlled timepiece 130 of the present embodiment includes the piezoelectric vibrators 1 electrically connected to a filter portion 131. The radio-controlled timepiece 130 is a timepiece provided with the function of displaying the correct time by automatically correcting the time upon receipt of a standard radio wave including the clock information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz has a nature to propagate along the land surface and a nature to propagate while reflecting between the ionospheric layer and the land surface, and therefore has a propagation range wide enough to cover all Japan by the two transmission centers.

Hereinafter, the functional configuration of the radio-controlled timepiece 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 1.

In the present embodiment, the piezoelectric vibrators 1 include quartz vibrator portions 138 and 139 having resonance frequencies at 40 kHz and 60 kHz which are the same as the carrier frequency.

Furthermore, the filtered signal at the predetermined frequency is detected and demodulated by a detection and rectification circuit 134. Subsequently, the time code is extracted by a waveform shaping circuit 135 and counted by the CPU 136. The CPU 136 reads out information about the current year, the total number of days, a day of the week, and the time. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given to the example in Japan, the frequency of the long standard wave is different overseas. For example, a standard wave of 77.5 kHz is used in Germany. When the radio-controlled timepiece 130 which is also operable overseas is incorporated into a portable device, the piezoelectric vibrator 1 set at the frequency different from the frequencies used in Japan is required.

According to the radio-controlled timepiece 130 of the present embodiment, since the radio-controlled timepiece includes the piezoelectric vibrator 1 having improved quality, it is possible to achieve an improvement in the quality of the radio-controlled timepiece itself. In addition to this, it is possible to count the time highly accurately and stably over a long period of time.

Although the embodiments of the present invention have been described in detail with reference to the drawings, the detailed configuration is not limited to the embodiments, and various changes can be made in design without departing from the spirit of the present invention.

In addition, although the embodiment has been described by way of an example of a tuning-fork type piezoelectric vibrating reed 5, the piezoelectric vibrating reed of the present invention is not limited to the tuning-fork type piezoelectric vibrating reed but may be a thickness-shear type piezoelectric vibrating reed, for example.

In addition, although the embodiment has been described for the case where the scribe line M' is formed on the outer end surface 50b of the lid board wafer 50 during the cutting step, and the cutting blade 70 is pressed from the outer end surface 40b of the base board wafer 40, the present invention is not limited to this. For example, the scribe line M' may be formed on the outer end surface 40b of the base board wafer 40, and the cutting blade 70 may be pressed from the outer end surface 50b of the lid board wafer 50.

In addition, the recess portion 3a may be formed on the base board wafer 40, and the recess portion 3a may be formed on each of the two wafers 40 and 50.

Furthermore, the first and second laser sources are only examples and can be appropriately selected in accordance with materials.

In addition, the ratio of the depth dimension D of the scribe line M' to the width dimension W, the blade edge angle A of the cutting blade 70, the thickness of the separator 83, and the like can be appropriately changed within the above-mentioned range.

The invention claimed is:

1. A method for producing piezoelectric vibrators each containing a piezoelectric vibrating strip inside, comprising:
   (a) defining, along imaginary boundary lines, a plurality of first substrates on a first wafer and a plurality of second substrates on a second wafer;
   (b) layering, between a bonding electrode and a table, the first and second wafers such that at least some of the first substrates substantially coincide respectively with at least some of the corresponding second substrates, with a bonding film being placed between respective pairs of at least some of the coinciding first and second substrates;

(c) hermetically bonding the first and second substrates of at least some of the respective pairs via the bonding film;

(d) cutting off each of at least some of the hermetically bonded pairs, which includes removing the bonding the bonding film lying on the boundary lines and scribing the first wafer with a laser along the boundary lines to form grooves with a ratio of whose width and depth ranges from 0.8 to 6.0, in which the scribing is performed after the removing the bonding film.

2. The method according to claim 1, wherein cutting off each of at least some of the hermetically bonded pairs comprises securing the second wafer of the layered first and second wafers on an adhesive sheet.

3. The method according to claim 2, wherein cutting off each of at least some of the hermetically bonded pairs comprises pressing a cutting blade along the boundary lines on the second wafer via the adhesive sheet.

4. The method according to claim 3, wherein pressing the cutting blade comprises pressing the cutting blade with a stress of about 10 kg/inch.

5. The method according to claim 3, wherein pressing the cutting blade comprises pressing the cutting blade having a base thickness of about 10 mm and a blade edge angle ranging from 80° to 100°.

6. The method according to claim 3, wherein pressing the cutting blade comprises pressing the cutting blade having a blade edge shaped to have a blade edge angle of about 90° and a radius curvature of about 10 μm.

7. The method according to claim 3, wherein cutting off each of at least some of the hermetically bonded pairs comprises expanding the adhesive sheet to separate the cut-off hermetically bonded pairs respectively from one another.

8. The method according to claim 1, wherein removing the bonding film comprises removing the bonding film with a laser having a spot diameter ranging from about 10 μm to about 30 μm, an average output of about 1.0 W at a processing point and a modulated frequency of about 20 kHz, and scanned at a speed of about 200 mm/sec.

9. The method according to claim 1, wherein scribing the first wafer with a laser comprises scribing the first wafer with a laser to form grooves in a shape of letter "V" whose width and depth are about 14 μm and about 11 μm, respectively.

10. The method according to claim 1, wherein scribing the first wafer with a laser comprises scribing the first wafer with a laser having an output ranging from about 250 mW to about 600 mW at the processing point, a pulse energy of about 100 μJ and a processing threshold fluence of about 30 J/(cm$^2$ pulse), and scanned at a speed ranging from about 40 mm/sec to about 60 mm/sec.

* * * * *